US009301434B2

(12) United States Patent
Kuwano et al.

(10) Patent No.: US 9,301,434 B2
(45) Date of Patent: Mar. 29, 2016

(54) POWER CONVERSION APPARATUS

(75) Inventors: Morio Kuwano, Hitachinaka (JP); Yosei Hara, Hitachinaka (JP); Haruki Hamada, Hitachinaka (JP)

(73) Assignee: Hitachi Automotive Systems, Ltd., Hitachinaka-shi (JP)

( * ) Notice: Subject to any disclaimer, the term of this patent is extended or adjusted under 35 U.S.C. 154(b) by 237 days.

(21) Appl. No.: 14/131,765

(22) PCT Filed: Jul. 25, 2012

(86) PCT No.: PCT/JP2012/068847
§ 371 (c)(1),
(2), (4) Date: Jan. 9, 2014

(87) PCT Pub. No.: WO2013/015319
PCT Pub. Date: Jan. 31, 2013

(65) Prior Publication Data
US 2014/0160822 A1 Jun. 12, 2014

(30) Foreign Application Priority Data

Jul. 25, 2011 (JP) .................................. 2011-161533

(51) Int. Cl.
*H05K 7/20* (2006.01)
*H02M 7/00* (2006.01)
(Continued)

(52) U.S. Cl.
CPC ................ *H05K 7/209* (2013.01); *B60L 3/003* (2013.01); *B60L 3/0061* (2013.01); *B60L 11/005* (2013.01);
(Continued)

(58) Field of Classification Search
CPC ............ H05K 7/2089; H05K 7/20945; H05K 7/20218
USPC ..................... 361/699, 702, 705, 104.33, 185, 361/679.46, 703, 767, 775, 831; 363/16, 363/37, 55, 71, 95, 97–98, 120, 131, 141
See application file for complete search history.

(56) References Cited

U.S. PATENT DOCUMENTS 6,898,072 B2    5/2005  Beihoff et al.
7,187,568 B2 *  3/2007  Radosevich ............ H02M 1/44
                                                    361/699

(Continued)

FOREIGN PATENT DOCUMENTS

EP    2 023 473 A2    2/2009
JP    3-159710 A      7/1991

(Continued)

OTHER PUBLICATIONS

Extended European Search Report issued in counterpart European Application No. 12816900.0 dated Apr. 20, 2015 (Seven (7) pages).

(Continued)

*Primary Examiner* — Timothy J Dole
*Assistant Examiner* — Ishrat Jamali
(74) *Attorney, Agent, or Firm* — Crowell & Moring LLP

(57) ABSTRACT

Provided is a power conversion apparatus that includes a power semiconductor module, a smoothing capacitor module, an alternating-current bus bar, a control circuit unit to control the power semiconductor element, and a flow channel formation body to form a flow channel through which a cooling medium flows. The power semiconductor module has a first heat dissipation portion and a second heat dissipation portion facing the first heat dissipation portion. A flow channel formation body external portion of the flow channel formation body has a first surface wall that faces the first heat dissipation portion with the flow channel therebetween, a second surface wall that faces the second heat dissipation portion with the flow channel therebetween, and a sidewall to connect the first surface wall and the second surface wall. The sidewall has an opening to insert the power semiconductor module into the flow channel.

14 Claims, 17 Drawing Sheets

(51) Int. Cl.

| | |
|---|---|
| *B60L 11/14* | (2006.01) |
| *H05K 7/14* | (2006.01) |
| *B60L 3/00* | (2006.01) |
| *B60L 11/00* | (2006.01) |
| *B60L 15/00* | (2006.01) |
| *B60L 15/20* | (2006.01) |

(52) U.S. Cl.
CPC .............. *B60L 11/14* (2013.01); *B60L 15/007* (2013.01); *B60L 15/2009* (2013.01); *H02M 7/003* (2013.01); *H05K 7/1432* (2013.01); *H05K 7/2089* (2013.01); *H05K 7/20218* (2013.01); *H05K 7/20927* (2013.01); *H05K 7/20945* (2013.01); *B60L 2210/40* (2013.01); *B60L 2220/14* (2013.01); *B60L 2240/36* (2013.01); *B60L 2240/423* (2013.01); *B60L 2240/443* (2013.01); *B60L 2240/525* (2013.01); *B60L 2270/145* (2013.01); *Y02T 10/642* (2013.01); *Y02T 10/70* (2013.01); *Y02T 10/7022* (2013.01); *Y02T 10/7077* (2013.01); *Y02T 10/7241* (2013.01); *Y02T 10/7275* (2013.01)

(56) References Cited

U.S. PATENT DOCUMENTS

| | | | |
|---|---|---|---|
| 7,622,873 B2 * | 11/2009 | Takata | ............... H02P 6/182 318/362 |
| 7,710,721 B2 * | 5/2010 | Matsuo | ............... H01L 23/473 165/104.33 |
| 8,064,234 B2 | 11/2011 | Tokuyama et al. | |
| 8,376,069 B2 | 2/2013 | Nakatsu et al. | |
| 8,422,235 B2 * | 4/2013 | Azuma | ............... B60K 6/445 361/688 |
| 2007/0002594 A1 * | 1/2007 | Otsuka | ............... H02M 7/003 363/37 |
| 2009/0040724 A1 * | 2/2009 | Nishikimi | ......... H05K 7/20927 361/699 |
| 2009/0231811 A1 * | 9/2009 | Tokuyama | ............. H01L 23/36 361/699 |
| 2010/0025126 A1 * | 2/2010 | Nakatsu | ............... B60L 11/00 180/65.1 |
| 2010/0097765 A1 * | 4/2010 | Suzuki | ............... B60K 6/365 361/699 |
| 2010/0188813 A1 * | 7/2010 | Nakatsu | ............... H02M 7/003 361/689 |
| 2012/0087095 A1 | 4/2012 | Tokuyama et al. | |
| 2012/0250253 A1 | 10/2012 | Chou et al. | |

FOREIGN PATENT DOCUMENTS

| | | |
|---|---|---|
| JP | 2004-312866 A | 11/2004 |
| JP | 2005-516570 A | 6/2005 |
| JP | 2008-193867 A | 8/2008 |
| JP | 2010-35347 A | 2/2010 |
| JP | 2010-258315 A | 11/2010 |
| WO | WO 2011/083578 A1 | 7/2011 |

OTHER PUBLICATIONS

Extended European Search Report issued in counterpart European Application No. 14171862.7 dated Apr. 10, 2015 (Seven (7) pages).
Corresponding International Search Report with English Translation dated Oct. 30, 2012 (four (4) pages).

\* cited by examiner

FIG. 7
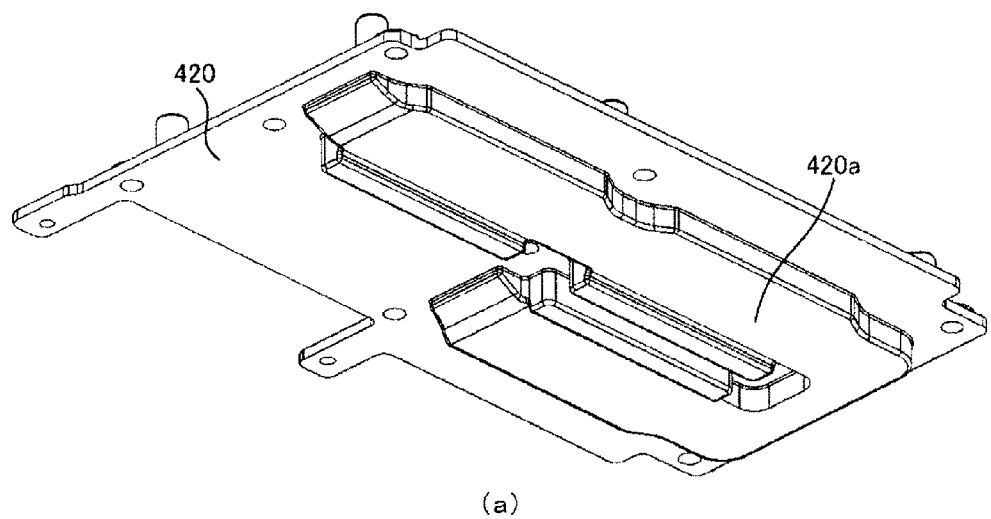
(a)
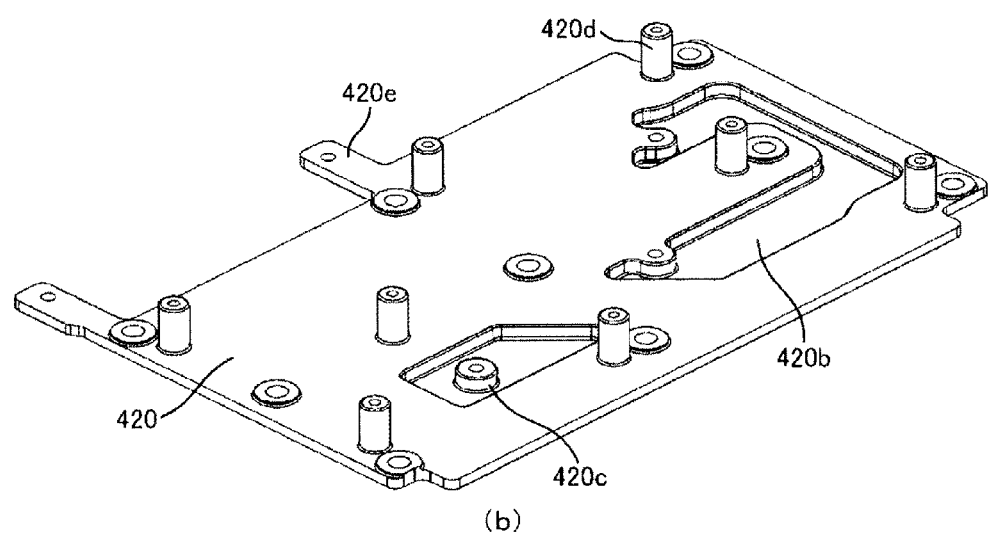
(b)

(a)  (b)

FIG. 16
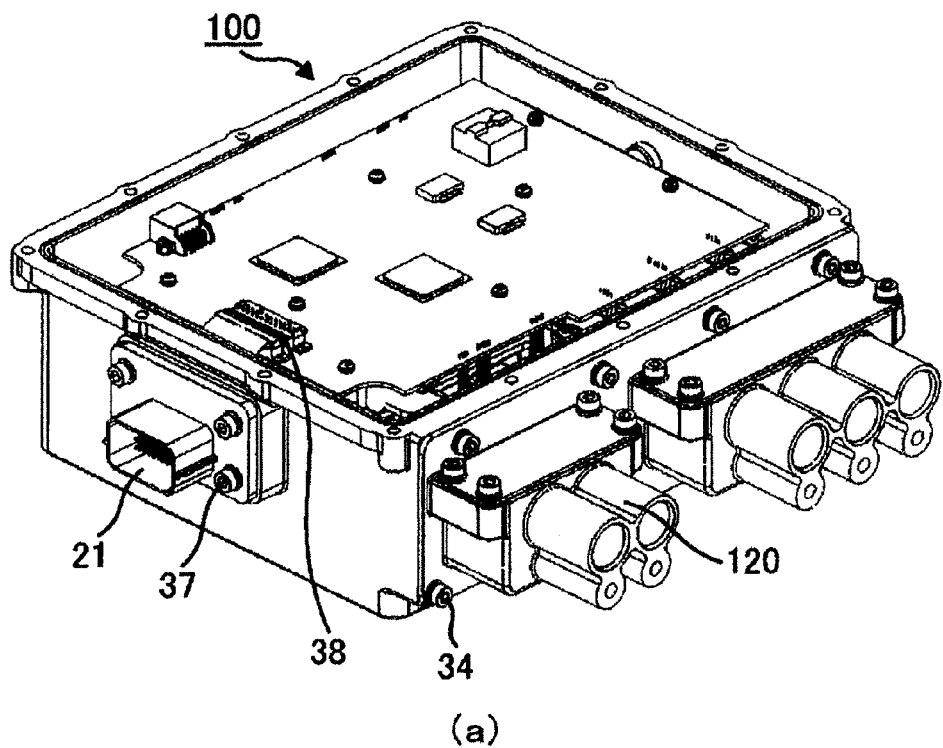
(a)
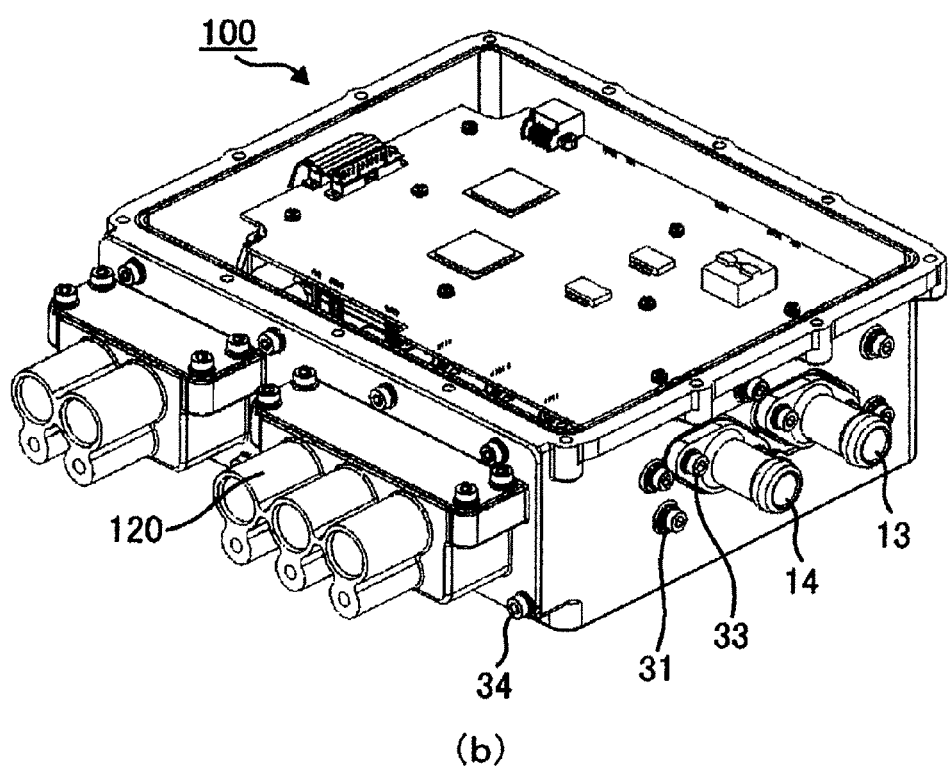
(b)

FIG. 17
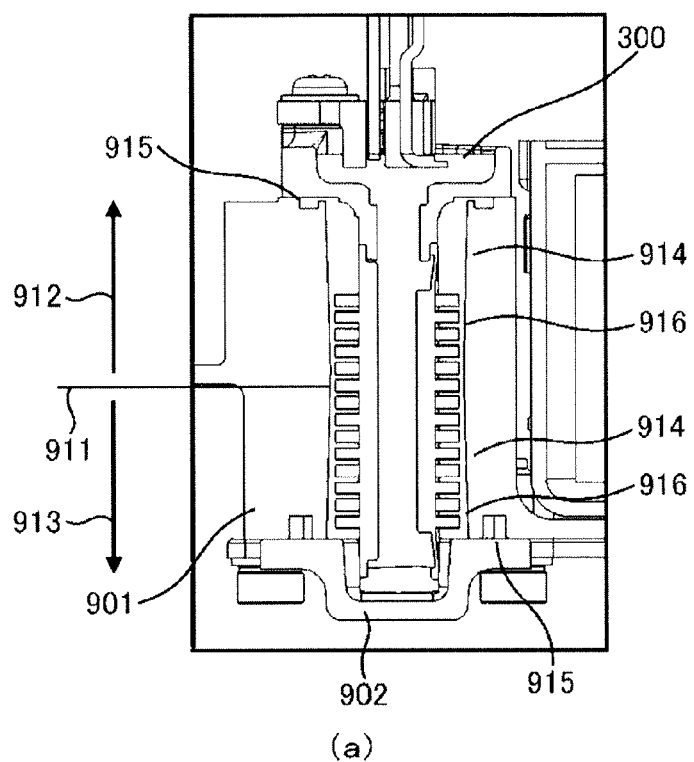
(a)
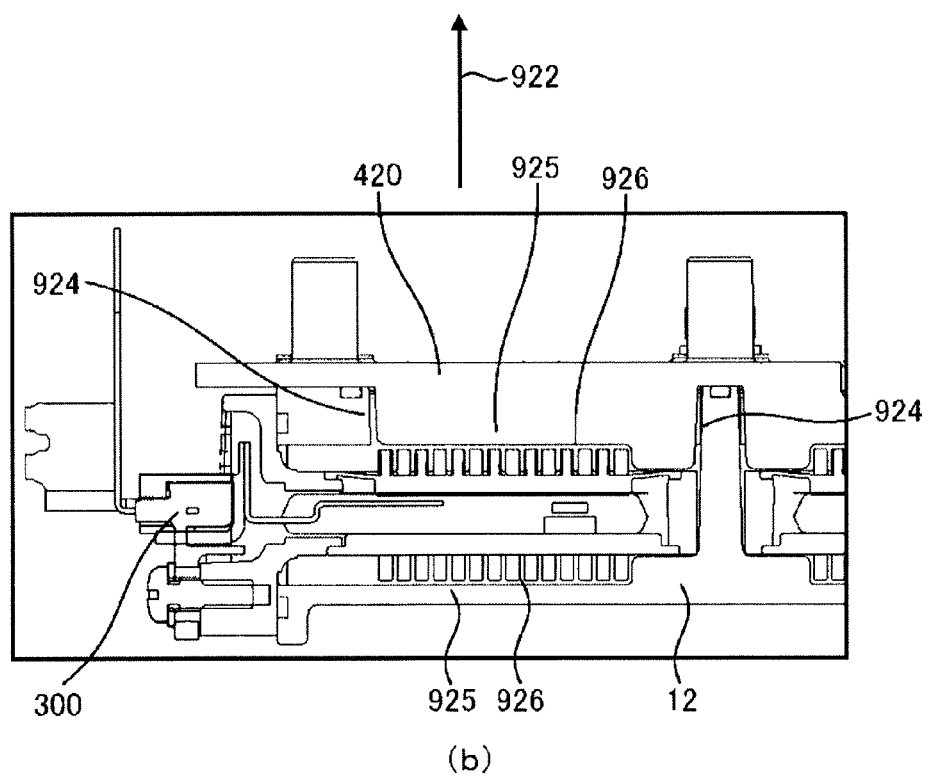
(b)

POWER CONVERSION APPARATUS

TECHNICAL FIELD

The present invention relates to a power conversion apparatus that is used to convert direct-current power into alternating-current power or convert alternating-current power into direct-current power.

BACKGROUND ART

An example of a power conversion apparatus is disclosed in JP 2008-193867 A.

In JP 2008-193867 A, a configuration in which a semiconductor module has cooling metals provided on both sides, a semiconductor chip for an upper arm and a semiconductor chip for a lower arm are interposed between the cooling metals, and the semiconductor module is inserted into a water channel casing body is disclosed.

CITATION LIST

Patent Literature

PTL 1: JP 2008-193867 A

SUMMARY OF INVENTION

Technical Problem

However, according to the invention described in JP 2008-193867 A, there is a problem in that an entire dimension of an inverter (in particular, a height direction) increases.

Solution to Problem

According to a first aspect of the present invention, a power conversion apparatus includes a power semiconductor module that has a power semiconductor element to convert a direct current into an alternating current, a smoothing capacitor module that smoothes the direct current, an alternating-current bus bar that transmits an alternating-current output of the power semiconductor element, a control circuit unit that controls the power semiconductor element, and a flow channel formation body that forms a flow channel through which a cooling medium flows. The power semiconductor module has a first heat dissipation portion and a second heat dissipation portion facing the first heat dissipation portion with the power semiconductor element therebetween, a flow channel formation body external portion of the flow channel formation body has a first surface wall that faces the first heat dissipation portion of the power semiconductor module with the flow channel therebetween, a second surface wall that faces the second heat dissipation portion of the power semiconductor module with the flow channel therebetween, at the opposite side of the first surface wall with the power semiconductor module therebetween, and a sidewall that connects the first surface wall and the second surface wall, the sidewall has an opening to insert the power semiconductor module into the flow channel, the smoothing capacitor module is arranged at a position facing the second surface wall of the flow channel formation body external portion, the alternating-current bus bar is arranged at a position facing the first surface wall of the flow channel formation body external portion, and the control circuit unit is arranged at a position facing the alternating-current bus bar, at the opposite side of the first surface wall of the flow channel formation body external portion with the alternating-current bus bar therebetween.

According to a second aspect of the present invention, it is preferable that the flow channel formation body is formed to be physically separated from a housing and is fixed to the housing by a fixator in the power conversion apparatus of the first aspect.

According to a third aspect of the present invention, it is preferable that the power semiconductor module, the smoothing capacitor module, the alternating-current bus bar, and the control circuit unit are further installed in the housing in a state in which the power semiconductor module, the smoothing capacitor module, the alternating-current bus bar, and the control circuit unit are installed in the flow channel formation body in the power conversion apparatus of the first aspect.

According to a fourth aspect of the present invention, it is preferable that a connection portion of the flow channel of the flow channel formation body and an external device is exposed to the outside of the housing through an opening formed in the housing in the power conversion apparatus of the first aspect.

According to a fifth aspect of the present invention, it is preferable that the power conversion apparatus of the first aspect further includes a flange portion that includes a connection portion of the flow channel of the flow channel formation body and an external device, wherein the flange portion includes a sealing member in a portion contacting a case becoming a casing.

According to a sixth aspect of the present invention, it is preferable that the first surface wall of the flow channel formation body has an opening and the flow channel formation body further includes a flow channel cover to close the opening of the first surface wall in the power conversion apparatus of the first aspect.

According to a seventh aspect of the present invention, it is preferable that a shape of a surface of the flow channel side of the flow channel cover is a convex shape corresponding to an internal shape of the flow channel formation body and an external shape of the power semiconductor module in the power conversion apparatus of the sixth aspect.

According to an eighth aspect of the present invention, it is preferable that a surface of the side opposite to the flow channel side of the flow channel cover includes a dent portion in accordance with the convex shape and the flow channel cover has a boss to fix the alternating-current bus bar to the dent portion in the power conversion apparatus of the seventh aspect.

According to a ninth aspect of the present invention, it is preferable that the flow channel formation body has a boss to attach a current sensor in the power conversion apparatus of the first aspect.

According to a tenth aspect of the present invention, it is preferable that the flow channel formation body has a boss to attach a circuit board in the power conversion apparatus of the first aspect.

According to an eleventh aspect of the present invention, it is preferable that the control circuit unit is configured by arranging individual parts forming a driver circuit and a control circuit on one substrate in the power conversion apparatus of the first aspect.

According to a twelfth aspect of the present invention, it is preferable that a minimum distance between the first surface wall and the second surface wall of the flow channel formation body is almost equal to a dimension of a flange included in a case of the power semiconductor module in the power conversion apparatus of the first aspect.

According to an thirteenth aspect of the present invention, it is preferable that the flow channel formation body is manufactured by a manufacturing method to cast a predetermined material in a mold, a surface of the sidewall is a tapered surface having an inclination, and surfaces of the first surface wall and the second surface wall are surfaces that do not need to be tapered in the power conversion apparatus of the first aspect.

According to a fourteenth aspect of the present invention, it is preferable that the power conversion apparatus is connected to a motor, the alternating-current bus bar transmits the alternating-current output to the motor, the flow channel of the flow channel formation body is formed in an U shape by providing partition walls, and the power semiconductor module is inserted into the flow channel through the opening of the sidewall in a direction vertical to a flowing direction of the cooling medium flowing through the flow channel and the first heat dissipation portion and the second heat dissipation portion are parallel to the first surface wall and the second surface wall, respectively, in the power conversion apparatus of the first aspect.

Advantageous Effects of Invention

According to the present invention, reduction of a dimension of a power conversion apparatus (height reduction) is enabled and a low cost can be realized.

BRIEF DESCRIPTION OF DRAWINGS

FIG. 1 is a system diagram illustrating a system of a hybrid vehicle.

FIG. 2 is a circuit diagram illustrating a configuration of an electric circuit illustrated in FIG. 1.

FIG. 3 is an exploded perspective view illustrating a configuration of a power conversion apparatus.

FIG. 4 is an exploded perspective view illustrating configurations of a flow channel formation body 12 and a power semiconductor module 300.

FIG. 5 is a perspective view exploded into components to describe an entire configuration of a power conversion module 200.

FIG. 6(a) is a cross-sectional perspective view illustrating a fastening configuration around an inlet pipe 13 and an outlet pipe 14. FIG. 6(b) is a cross-sectional perspective view illustrating a fastening configuration of a facing side of a surface to which the inlet and outlet pipes are attached.

[FIG.7] FIG. 7 (a) is a perspective view of a flow channel cover 420 when viewed from a side contacting an opening surface 400 of the flow channel formation body 12. FIG. 7(b) is a perspective view of the flow channel cover 420 when viewed from a top surface of the flow channel formation body 12.

[FIG.8] FIG. 8 (a) is a perspective view illustrating an outer appearance of a power semiconductor module 300a. FIG. 8 (b) is a cross-sectional view of the power semiconductor module 300a.

FIG. 9(a) is an internal cross-sectional view of the power semiconductor module 300a from which a module case 304, an insulating sheet 333, a first sealing resin 348, and a second sealing resin 351 are removed, to help understanding. FIG. 9(b) is a perspective view illustrating an internal configuration of the power semiconductor module 300a.

FIG. 10(a) is an exploded view to help understanding of a structure of FIG. 9(b). FIG. 10(b) is a circuit diagram of the power semiconductor module 300.

FIG. 11(a) is a circuit diagram illustrating a reduction effect of inductance. FIG. 11(b) is a diagram illustrating a reduction action of the inductance.

FIG. 12(a) is a perspective view of an auxiliary mold object 600. FIG. 12(B) is a transmission view of the auxiliary mold object 600.

FIG. 13 is an exploded perspective view illustrating an internal structure of a smoothing capacitor module 500.

FIG. 14 is a perspective view exploded into components to describe an entire configuration of a connector module 120.

FIG. 15 is a top view of a state in which a cover 8 is removed from aft power conversion apparatus 100.

[FIG.16] FIG. 16 is a perspective view illustrating parts attached to a side of the power conversion apparatus 100 illustrated in FIG. 15 in a manner easy-to-see.

[FIG.17] FIG. 17 is a cross-sectional view of a flow channel formation body and a cooling medium passage of the power semiconductor module 300. FIG. 17(a) is a cross-sectional view of a configuration according to the related art. FIG. 17(b) is a cross-sectional view of this embodiment.

DESCRIPTION OF EMBODIMENTS

According to the invention described in JP 2008-193867 A, an opening to insert a semiconductor module is provided at the side of a top surface of a water channel casing. For this reason, it is necessary to provide a space in a height direction of the semiconductor module to some extent. As a result, an entire dimension of an inverter (in particular, a height direction) may increase. It is thought that, if the opening to insert the semiconductor module is provided at the side of the water channel casing, height reduction of components of a power conversion apparatus can be achieved, thereby making it possible to improve manufacturing assemblability and reduce a cost. An object of the present invention is to provide a power conversion apparatus in which dimension reduction (height reduction) and cost reduction are enabled, with respect to a power conversion apparatus according to the related art. Embodiments of the present invention will be described using the drawings.

Figure 1:
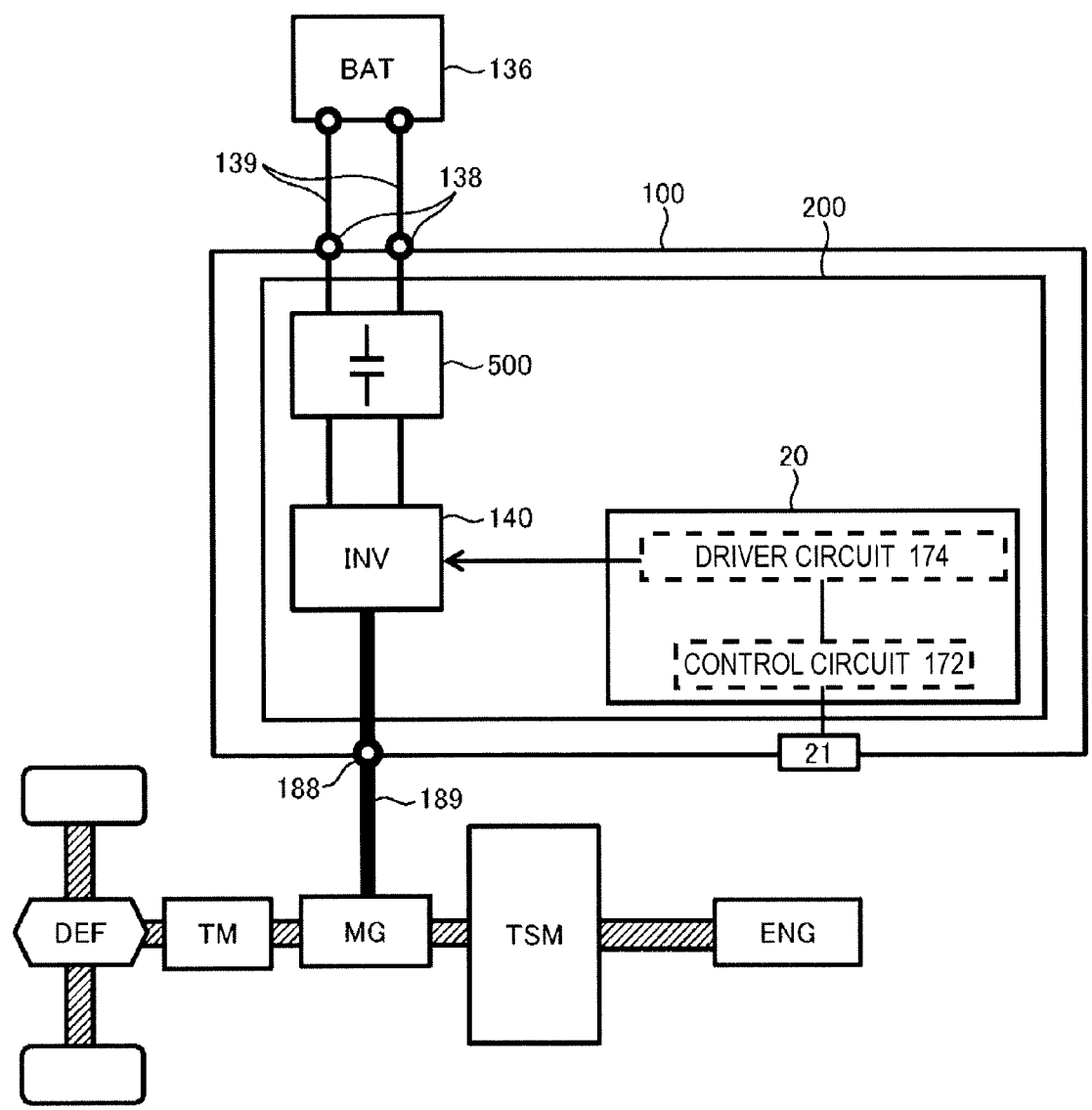
[FIG.1]

FIG. 1 illustrates a system in which a power conversion apparatus according to the present invention is applied to a so-called hybrid vehicle that runs using both an engine and a motor. The power conversion apparatus according to the present invention can be applied to a so-called electric vehicle running using only the motor as well as the hybrid vehicle and can be used as a power conversion apparatus to drive a motor used in a general industrial machine.

However, as described above or as described below, if the power conversion apparatus according to the present invention is applied to the hybrid vehicle or the electric vehicle in particular, superior effects are obtained at a point of view of miniaturization, a point of view of reliability, or other points of view. The power conversion apparatus applied to the hybrid vehicle has almost the same configuration as the power conversion apparatus applied to the electric vehicle. As a representative example, the power conversion apparatus applied to the hybrid vehicle will be described.

FIG. 1 is a diagram illustrating a control block of the hybrid vehicle (hereinafter, referred to as an "HEV"). An engine (ENG) and a motor generator (MG) generate driving torque of the vehicle. In addition, the motor generator has a function of converting mechanical energy applied from the outside to the motor generator into power as well as generating rotation torque.

The motor generator is, for example, a synchronous machine or an induction machine. As described above, the motor generator operates as a motor or a generator, according to an operating method. When the motor generator is mounted to the vehicle, it is desirable to obtain a small size and a high output and a synchronous motor of a permanent magnet type using a magnet such as neodymium (Nd) is suitable. In addition, the synchronous motor of the permanent magnet type has heat generation of a rotor smaller than that of an inductor motor and the synchronous motor is superior as a motor for the vehicle, at this point of view.

Output torque of an output side of the engine is transmitted to the motor generator through a power distribution mechanism (TSM) and rotation torque from the power distribution mechanism or rotation torque generated by the motor generator is transmitted to a wheel through a transmission TM and a differential gear DEF. Meanwhile, at the time of regenerative braking operating, the rotation torque is transmitted from the wheel to the motor generator and alternating-current power is generated on the basis of the supplied rotation torque. The generated alternating-current power is converted into direct-current power by the power conversion apparatus 100 as described below and charges a battery 136 for a high voltage and charged power is used as traveling energy again.

Next, the power conversion apparatus 100 will be described. An inverter circuit 140 is electrically connected to the battery 136 through a direct-current connector portion 138 and power is exchanged between the battery 136 and the inverter circuit 140. When the motor generator is operated as the motor, the inverter circuit 140 converts the direct-current power supplied from the battery 136 through the direct-current connector portion 138 into the alternating-current power and supplies the alternating-current power to the motor generator through the alternating-current connector portion 188.

In this embodiment, a motor generator unit is operated as a motor unit by power of the battery 136, so that driving of the vehicle is enabled by only power of the motor generator. In addition, in this embodiment, the motor generator unit is operated as the generator unit and the motor generator is operated by the power of the engine or the power from the wheel to generate power, so that charging of the battery 136 is enabled.

Further, the power conversion apparatus 100 includes a smoothing capacitor module 500 to smooth the direct-current power supplied to the inverter circuit 140.

The power conversion apparatus 100 includes a signal connector 21 for communication to receive a command from an upper control device not illustrated in the drawings or transmit data showing a state to the upper control device. A control amount of the motor generator is operated by a control circuit 172 on the basis of a command from the signal connector 21, it is operated whether to operate the motor generator as the motor or operate the motor generator as the generator, a control pulse is generated on the basis of an operation result, and the control pulse is supplied to a driver circuit 174. The driver circuit 174 generates a driving pulse to control the inverter circuit 140, on the basis of the control pulse.

Figure 2:
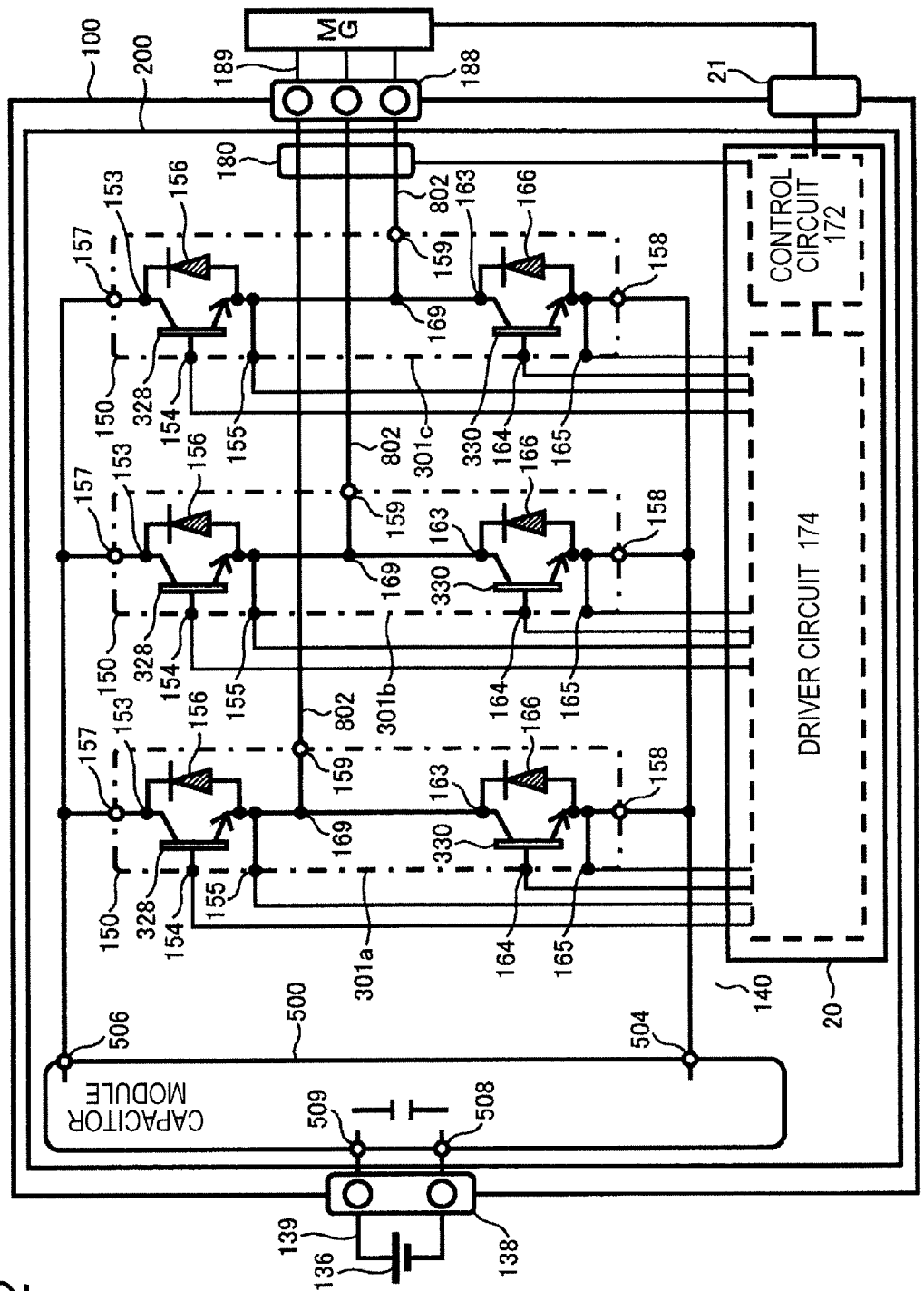
[FIG.2]

Next, a configuration of an electric circuit of the inverter circuit 140 will be described using FIG. 2. Hereinafter, an insulated gate bipolar transistor is used as a semiconductor element and the insulated gate bipolar transistor is simply referred to as an IGBT. The inverter circuit 140 includes series circuits 150 of upper and lower arms including an IGBT 328 and a diode 156 operating as the upper arm and an IGBT 330 and a diode 166 operating as the lower arm, to correspond to three phases including a U phase, a V phase, and a W phase of alternating-current power to be output.

In this embodiment, the three phases correspond to winding wires of three phases of armature winding wires of the motor generator. In the series circuit 150 of the upper and lower arms of each of the IGBTs of the three phases, an alternating current is output from an intermediate electrode 169 to be a center portion of the series circuit. The alternating current is connected to a bus bar holding member 802 to be an alternating-current power line for the motor generator through an alternating-current terminal 159 and an alternating-current connector portion 188 and is transmitted.

A collector electrode 153 of the IGBT 328 of the upper arm is electrically connected to a positive electrode side capacitor terminal 506 of the smoothing capacitor module 500 through a positive electrode terminal 157 and an emitter electrode of the IGBT 330 of the lower arm is electrically connected to a negative electrode side capacitor terminal 504 of the smoothing capacitor module 500 through a negative electrode terminal 158.

As described above, the control circuit 172 receives a control command from the upper control device through the signal connector 21, generates a control pulse to be a control signal to control the IGBT 328 or the IGBT 330 forming the upper arm or the lower arm of the series circuit 150 of each phase forming the inverter circuit 140, on the basis of the control command, and supplies the control pulse to the driver circuit 174. The driver circuit 174 supplies a driving pulse to control the IGBT 328 or the IGBT 330 forming the upper arm or the lower arm of the series circuit 150 of each phase to the IGBT 328 or the IGBT 330 of each phase, on the basis of the control pulse. The IGBT 328 or the IGBT 330 performs a conduction or interception operation on the basis of the driving pulse from the driver circuit 174 and converts direct-current power supplied from the battery 136 into three-phase alternating-current power and the controlled and converted alternating-current power is supplied to the motor generator.

The IGBT 328 includes a collector electrode 153, an emitter electrode 155 for a signal, and a gate electrode 154. In addition, the IGBT 330 includes a collector electrode 163, an emitter electrode 165 for a signal, and a gate electrode 164. The diode 156 is electrically connected between the collector electrode 153 and the emitter electrode. In addition, the diode 166 is electrically connected between the collector electrode 163 and the emitter electrode 155.

As a power semiconductor element for switching, a metal-oxide semiconductor field-effect transistor (hereinafter, simply referred to as a MOSFET) may be used. In this case, the diode 156 and the diode 166 become unnecessary. When the direct-current voltage is relatively high, the IGBT is preferable as the power semiconductor element for the switching. When the direct-current voltage is relatively low, the MOSFET is preferable as the power semiconductor element for the switching.

The smoothing capacitor module 500 includes a plurality of positive electrode side capacitor terminals 506, a plurality of negative electrode side capacitor terminals 504, a positive electrode side power supply terminal 509, and a negative electrode side power supply terminal 508. The direct-current power of the high voltage from the battery 136 is supplied to the positive electrode side power supply terminal 509 or the negative electrode side power supply terminal 508 through the direct-current connector portion 138 and is supplied from the plurality of positive electrode side capacitor terminals 506 or the plurality of negative electrode side capacitor terminals 504 of the smoothing capacitor module 500 to the inverter circuit 140.

Meanwhile, the direct-current power converted from the alternating-current power by the inverter circuit 140 is supplied from the positive electrode side capacitor terminal 506 or the negative electrode side capacitor terminal 504 to the smoothing capacitor module 500, is supplied from the positive electrode side power supply terminal 509 or the negative electrode side power supply terminal 508 to the battery 136 through the direct-current connector portion 138, and is accumulated in the battery 136.

The control circuit 172 includes a microcomputer to operate switching timings of the IGBT 328 and the IGBT 330. As information input to the microcomputer, a target torque value requested for the motor generator, a current value supplied from the series circuit 150 of the upper and lower arms to the motor generator, and a magnetic pole position of the rotor of the motor generator exist. The target torque value is based on a command signal output from the upper control device not illustrated in the drawings. The current value is detected by a current sensor 180 and it is fed back whether the current becomes the commanded current. The magnetic pole position is detected on the basis of a detection signal output from a rotation magnetic pole sensor (not illustrated in the drawings) such as a resolver provided in the motor generator. In this embodiment, the example of the case in which the current sensor 180 detects the three-phase current value has been described. However, a current value corresponding to the two phases may be detected or a current corresponding to the three phases may be acquired by an operation.

The microcomputer in the control circuit 172 operates current command values of d and q axes of the motor generator on the basis of the target torque value, operates voltage command values of the d and q axes on the basis of differences between the operated current command values of the d and q axes and the detected current values of the d and q axes, and converts the operated voltage command values of the d and q axes into voltage command values of the U phase, the V phase, and the W phase on the basis of the detected magnetic pole position. In addition, the microcomputer generates a modulation wave in a pulse shape on the basis of a comparison between a carrier wave (triangular wave) and a fundamental wave (sine wave) based on the voltage command values of the U-phase, the V-phase, and the W-phase and outputs the generated modulation wave as a pulse width modulation (PWM) signal to the driver circuit 174. When the driver circuit 174 drives the lower arm, the driver circuit 174 outputs a drive signal obtained by amplifying the PWM signal to a gate electrode of the IGBT 330 of the corresponding lower arm.

In addition, when the driver circuit 174 drives the upper arm, the driver circuit 174 shifts a level of a reference potential of the PWM signal to a level of a reference potential of the upper arm, amplifies the PWM signal, and outputs the PWM signal as the drive signal to the gate electrode of the IGBT 328 of the corresponding upper arm.

In addition, the control unit 170 performs abnormality detection (an overcurrent, an overvoltage, an excess temperature, and the like) to protect the series circuit 150 of the upper and lower arms. For this reason, sensing information is input to the control circuit 172. For example, information regarding the current flowing to the emitter electrodes of the IGBTs 328 and 330 is input from the emitter electrodes 155 and 165 for the signals in each arm to a corresponding driving unit (IC). As a result, each driving unit (IC) performs overcurrent detection. When the overcurrent is detected, the switching operations of the corresponding IGBTs 328 and 330 are stopped to protect the corresponding IGBTs 328 and 330 from the overcurrent. Information regarding the temperature of the series circuit 150 of the upper and lower arms is input from a temperature sensor (not illustrated in the drawings) provided in the series circuit 150 of the upper and lower arms to the microcomputer.

In addition, information of a voltage of the direct-current positive electrode side of the series circuit 150 of the upper and lower arms is input to the microcomputer. The microcomputer performs excess temperature detection and overvoltage detection on the basis of the information. When the excess temperature or the overvoltage is detected, the switching operations of both the IGBTs 328 and 330 are stopped.

Figure 3:
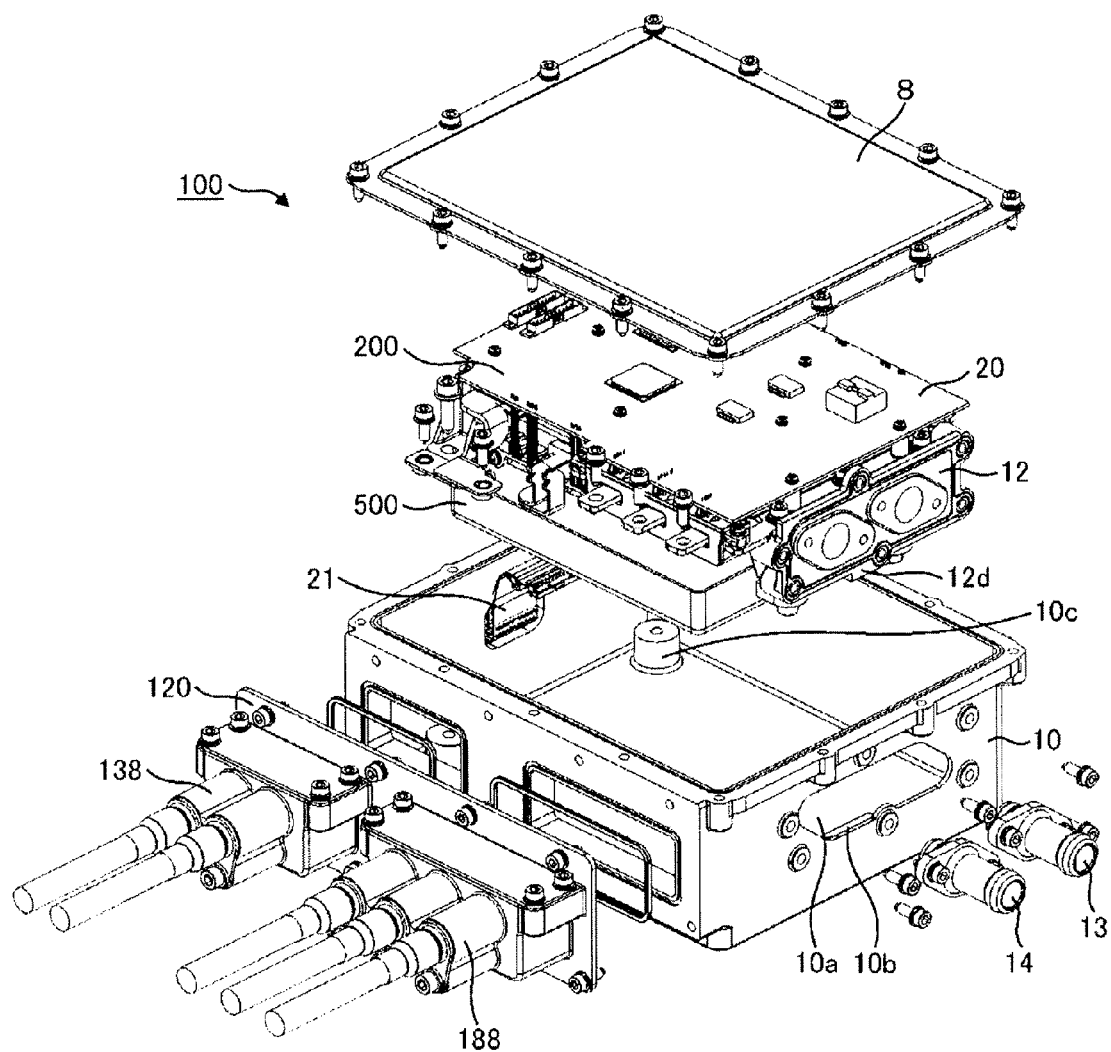
[FIG.3]

FIG. 3 illustrates an exploded perspective view of the power conversion apparatus 100 according to the embodiment of the present invention. The power conversion apparatus 100 has a power conversion module 200 to be described below as a core and has a housing 10 and a cover 8 to fix and protect the power conversion module 200. A connection portion with an external device is configured by a connector module 120 to be an input unit of a direct-current power supply and an output unit of an alternating-current power supply, a signal connector 21 to transmit a signal to a control circuit, and an inlet pipe 13 and an outlet pipe 14 to introduce/discharge a cooling medium to a flow channel formation body 12. The flow channel formation body 12 and the housing 10 are separated parts as illustrated in the drawings. The power conversion apparatus 100 has a bottom surface and a top surface formed in an approximately rectangular shape and thus, the power conversion apparatus is easily attached to the vehicle and is easily manufactured. In the following embodiment, a direction from the bottom surface of the housing 10 to the cover 8 is defined as an upward direction, an inversion direction thereof is defined as a downward direction, and a vertical direction is defined as a height direction.

The flow channel formation body 12 holds components such as a power semiconductor module 300, a smoothing capacitor module 500, a first alternating-current bus bar 801, and a circuit board 20 to be described below and cools down these components by the cooling medium.

The housing 10 houses circuit components forming the power conversion module 200. An opening is provided in a sidewall of the housing 10 and the signal connector 21 is fixed. The signal connector 21 is connected to an external control device through the opening and signal transmission is performed between the control circuit 172 provided in the circuit board 20 and the external control device such as the upper control device. Direct-current power of a low voltage to operate the control circuit in the power conversion apparatus 100 is supplied from the signal connector 21.

The connector module 120 to connect the external device and the direct-current and alternating-current power supplies is fixed to other opening provided in the sidewall of the housing 10. A direct-current connector portion 138 to exchange the direct-current power between the battery 136 and the connector module 120 is provided in the connector module 120 and a negative electrode side power line 139*b* and a positive electrode side power line 139*a* to supply high-voltage direct-current power to the inside of the power conversion apparatus 100 electrically connect the battery 136 and the smoothing capacitor module 500. In addition, an alternating-current connector portion 188 to exchange the alternating current between the motor generator and the power semiconductor module 300 is provided in the connector module 120 and alternating-current wiring lines 189*a* to 189*c* to supply high-voltage alternating-current power to the motor generator electrically connect the motor generator and power semiconductor modules 300*a* to 300*c*.

Figure 4:
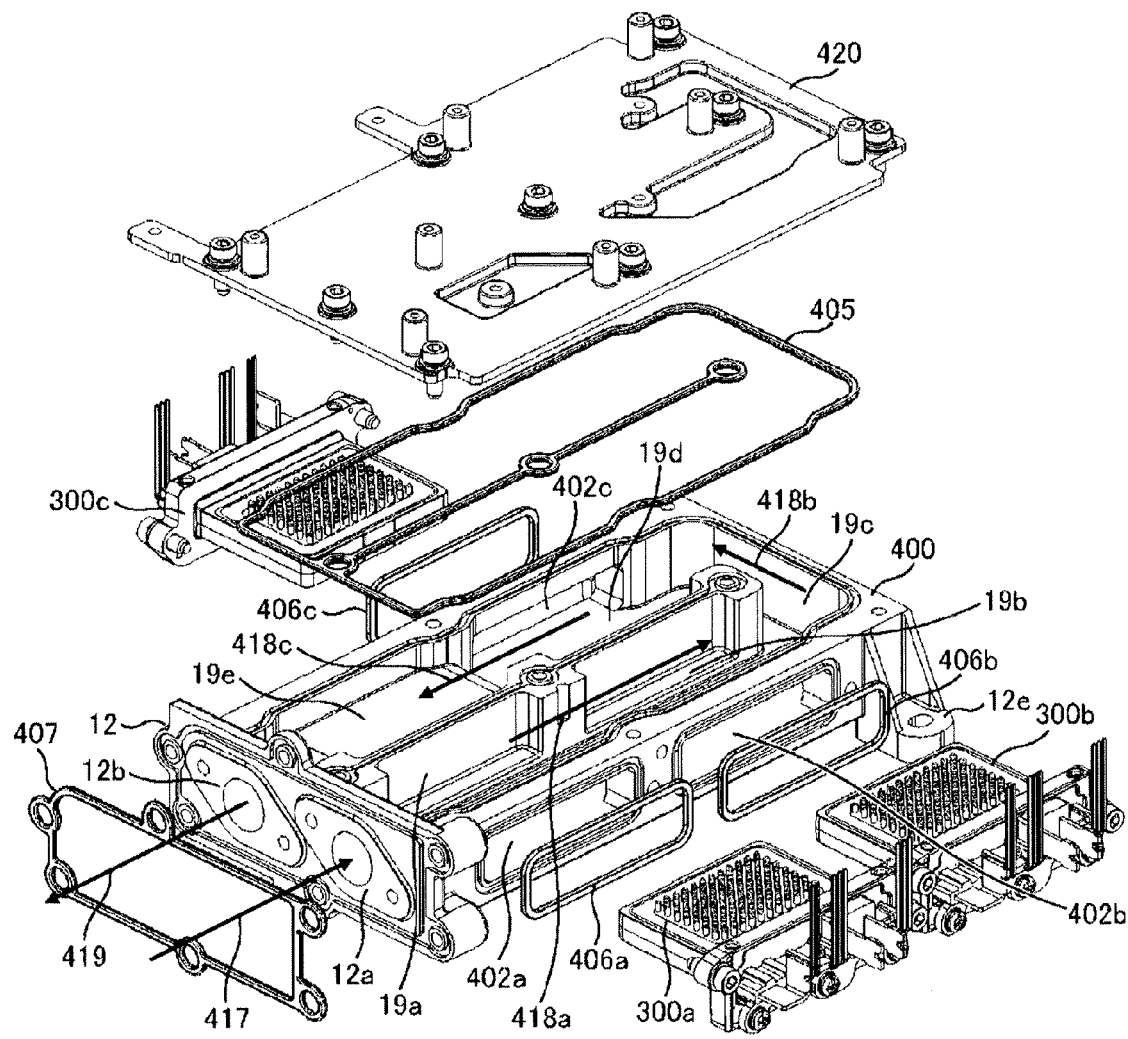
[FIG.4]

FIG. 4 is a perspective view exploded to help understanding of configurations of components embedded in the flow channel formation body 12 to be the component of the power conversion module 200 and a configuration of a water channel. The flow channel formation body 12 has a flat shape in which a dimension of a vertical direction is smaller than dimensions of the other directions. An inlet pipe connection portion 12a to connect the inlet pipe 13 and an outlet pipe connection portion 12b to connect the outlet pipe 14 are provided in the side, a cooling flow channel 19 is formed in a U shape to connect the two pipes, and a top surface of one side of the cooling flow channel 19 is opened.

The cooling medium flows from the inlet pipe 13, passes through a flow channel 19a into which the power semiconductor module 300a is inserted, a flow channel 19b into which the power semiconductor module 300b is inserted, a folded flow channel portion 19c, a flow channel 19d into which the power semiconductor module 300c is inserted, and a flow channel 19e, and is discharged by the outlet pipe 14.

The opening surface 400 is closed by a flow channel cover 420 and a flow channel cover portion sealing member 405. In the side of the flow channel formation body 12, openings 402a to 402c are formed along a flow of the cooling medium. The openings 402a to 402c are closed by the inserted power semiconductor modules 300a to 300c and flange portion sealing members 406a to 406c and the power semiconductor modules 300a to 300c are cooled down by the cooling medium passing through the cooling flow channel 19. That is, the power semiconductor modules 300a to 300c are inserted into the cooling flow channel 19 through the openings 402a to 402c, in a direction vertical to a flow direction of the cooling medium flowing through the cooling flow channel 19. In this way, the power semiconductor modules 300a to 300c are cooled down in a state in which a first heat dissipation surface 307A and a second heat dissipation surface 307B to be described below in the power semiconductor modules 300a to 300c are parallel to the top surface and the bottom surface of the flow channel formation body 12.

According to this embodiment, a minimum dimension of a height direction of the flow channel formation body 12 housing the power semiconductor module 300 (a minimum distance between the top surface and the bottom surface of the flow channel formation body 12) is suppressed to a dimension obtained by adding a thickness of the flow channel cover 420 to a width of a flange 304B to be described below, which is included in the power semiconductor module 300. Therefore, height reduction is enabled.

In addition, the opening surface 400 is provided on the top surface of the flow channel 19, so that the folded flow channel portion 19c is provided in the flow channel, a degree of freedom of the layout of the power semiconductor modules 300a to 300c increases without lowering cooling performance, and miniaturization is also enabled. In FIG. 4, the power semiconductor modules 300a and 300b are provided in the cooling flow channel 19 of a flow direction 418a of the cooling medium to be an outward path and the power semiconductor module 300c is provided in the cooling flow channel 19 of a flow direction 418c of the cooling medium to be a return path.

In addition to the above configuration, in a configuration in which the flow direction of the cooling medium is reversed or the power semiconductor modules 300a to 300c are arranged on one surface, a configuration in which the power semiconductor module 300b is inserted from a surface facing surfaces of the inlet pipe connection portion 12a and the outlet pipe connection portion 12b and is arranged at a position of the cooling flow channel 19c, or a configuration of using two motor generators in which the three power semiconductor modules 300 are arranged on one surface and the three power semiconductor modules 300 are arranged on a facing surface, height reduction and an effect regarding the height reduction are the same.

A main structure of the cooling flow channel 19 of the flow channel formation body 12 is made by casting of an aluminum material to be integrated with the flow channel formation body 12, so that the cooling flow channel 19 has an effect of increasing mechanical strength in addition to the cooling effect. In addition, the main structure is made by the aluminum casting, so that the flow channel formation body 12 and the cooling flow channel 19 are integrated with each other, heat conduction becomes good, and cooling efficiency is improved. By fixing the power semiconductor modules 300a to 300c to the cooling flow channel 19, the cooling flow channel 19 is completed and a water leak test of the water channel is performed.

Figure 5:
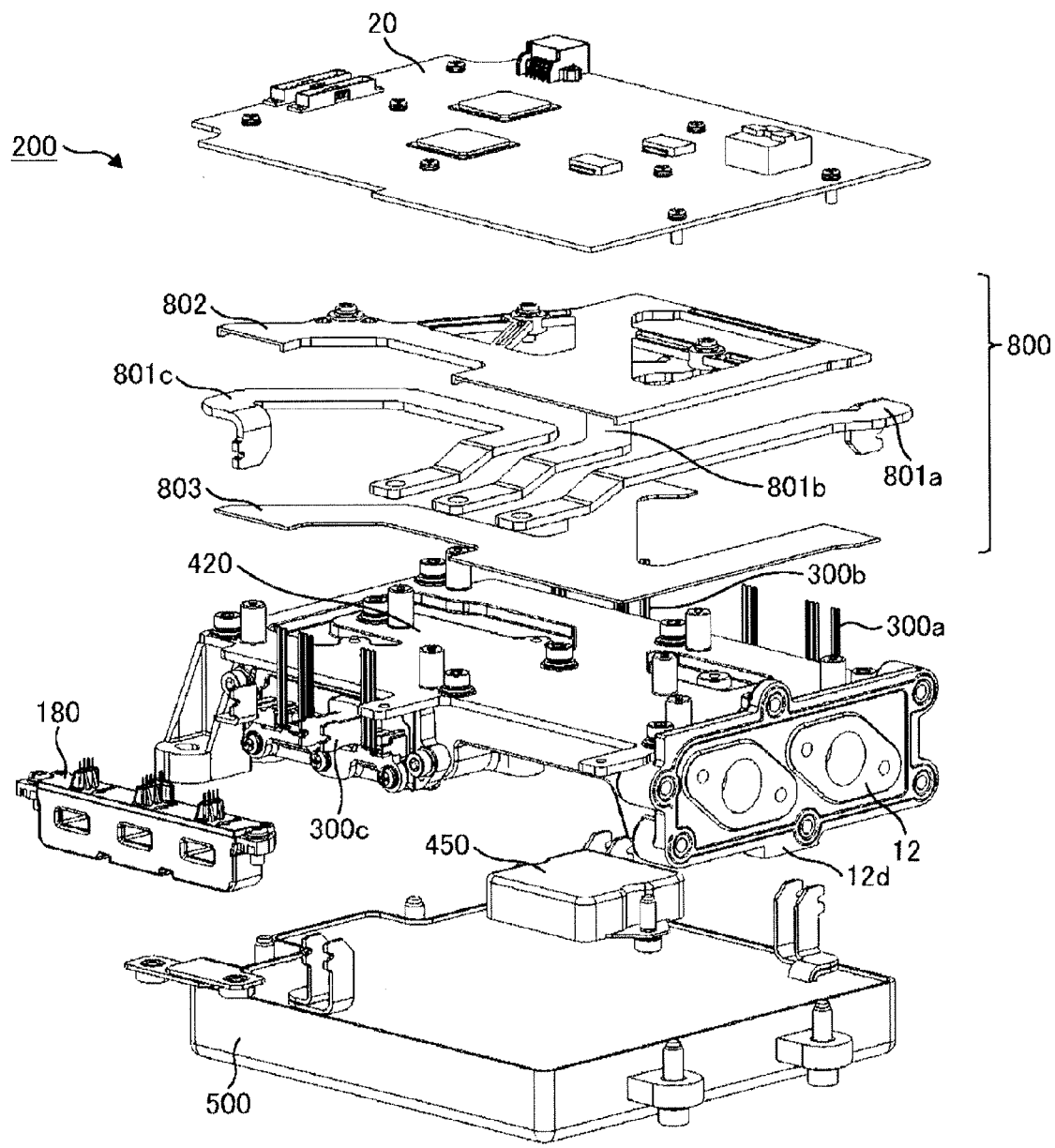
[FIG.5]

FIG. 5 is a perspective view exploded to help understanding of the configuration of the power conversion module 200. The power semiconductor module 300 is housed in the flow channel formation body 12. The smoothing capacitor module 500 is installed at a position adjacent to the bottom surface of the flow channel formation body 12.

Because the power semiconductor module 300 is not installed in a portion of the flow channel 19e of the flow channel formation body 12, the portion of the flow channel 19e can suppress the depth of the flow channel, the bottom surface of the flow channel formation body 12 forms a dent shape, and a resistor 450 is fixed to a dent portion. On the top surface of the flow channel cover 420 that forms the top surface of the flow channel formation body 12, the current sensor 180 is fixed by a boss and a bus bar assembly 800 is fixed.

The bus bar assembly 800 includes bus bar bodies 801a, 801b, and 801c to transmit alternating-current power, a heat transfer member 803, and a bus bar holding member 802. The flow channel cover 420 is fixed to a lower portion of the bus bar assembly and the circuit board 20 is fixed to an upper portion thereof. The alternating-current bus bars 801a to 801c and the terminals provided in the smoothing capacitor module 500 are electrically connected to the power semiconductor modules 300a to 300c and connection portions are joined by welding.

According to this embodiment, parts producing heat can be arranged in proximity to the top surface and the bottom surface in surfaces forming the surface of the flow channel formation body 12, that is, both surfaces having large areas. Therefore, cooling efficiency is greatly improved with respect to the configuration according to the related art.

As area that can be used by the smoothing capacitor module 500 in the layout, the same area as the flow channel formation body 12 can be used. Therefore, a dimension of a height direction can be suppressed while a capacity of a capacitor necessary for securing inverter performance is secured and height reduction is enabled.

In addition, in the circuit board 20, in the configuration according to the related art, an area that can be used by the substrate in the layout is small and thus, a substrate of the driver circuit 174 and a substrate of the control circuit 172 cannot be formed on the same surface. However, according to this embodiment, the driver circuit 174 and the control circuit 172 can be arranged on the same circuit board 20 and height reduction is enabled.

Because all of the parts forming the power conversion module 200 illustrated in FIG. 5 can be subjected to assembly work in a sub-assembled state before being installed in the housing 10, the assembly work including the welding is enabled from all directions of the power conversion module 200. As a result, a degree of freedom in design increases, so that miniaturization and cost reduction are enabled and productivity is improved at the production post.

As described in FIG. 3, because the flow channel formation body 12 and the housing 10 are separated parts, an inspection can be executed in a state of the power conversion module 200 at the point of production. For this reason, the parts such as the housing 10 are not discarded at the time of rejection by the inspection, which results in contributing to reducing a yield.

Figure 6:
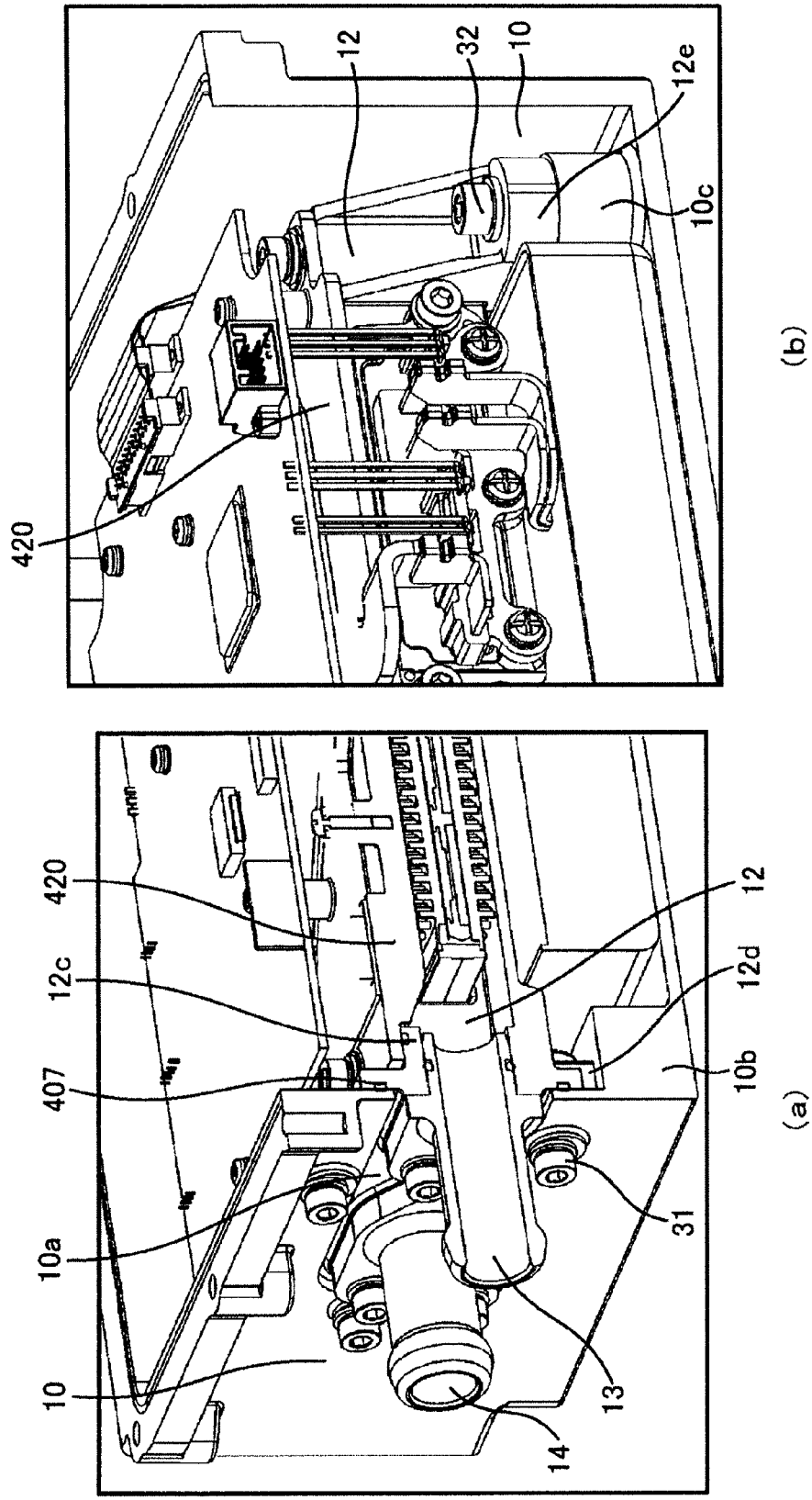
[FIG.6]
Figure 8:
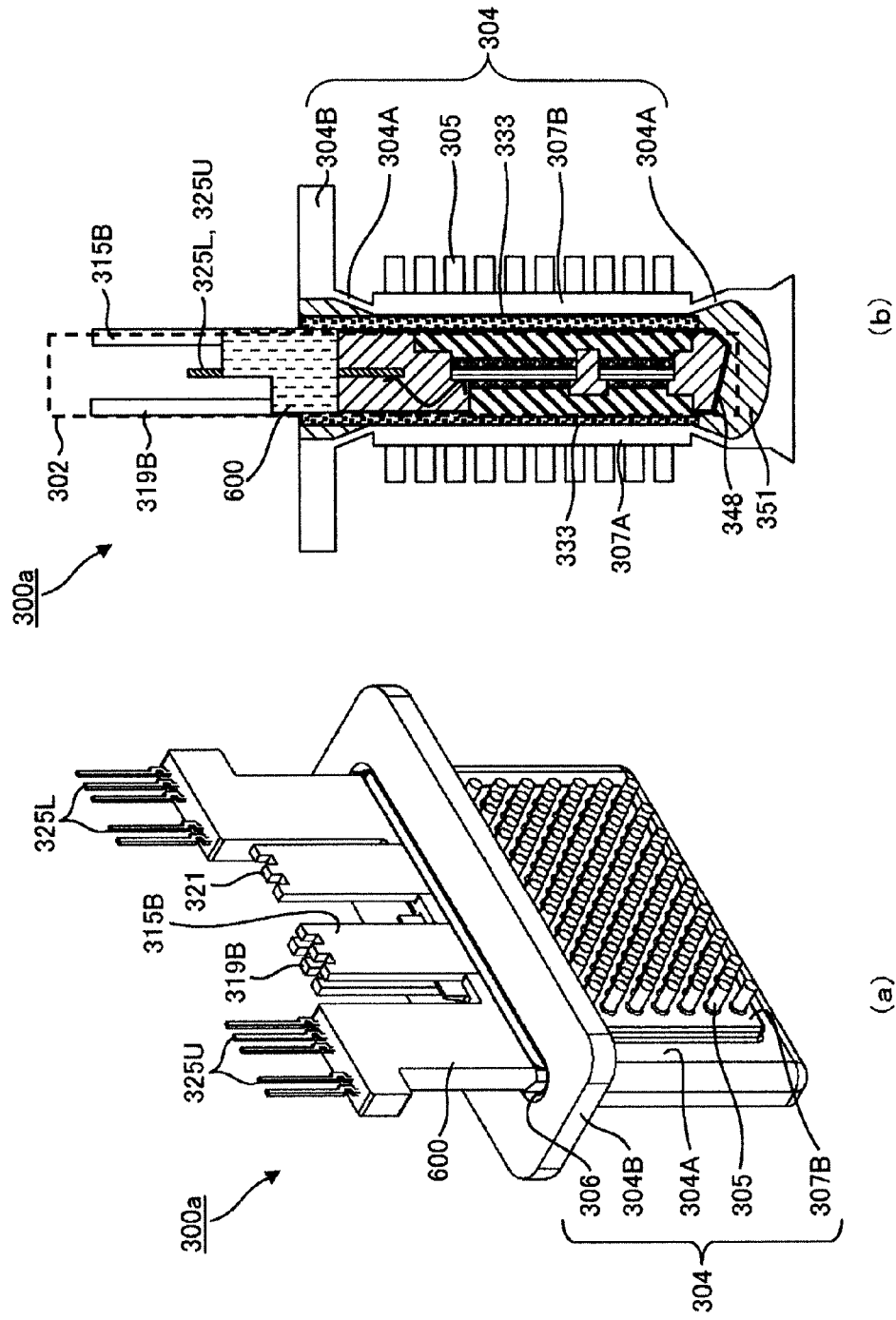

FIG. 6 illustrates a mechanism for fixing the flow channel formation body 12 to the housing 10. FIG. 6(a) is a cross-sectional view of surrounding portions of the inlet pipe 13 and the outlet pipe 14. In addition, FIG. 6(b) is a cross-sectional view of the facing side of the surface to which the inlet and outlet pipes are attached.

In FIG. 6(a), in the flow channel formation body 12, the inlet pipe connection portion 12a and the outlet pipe connection portion 12b illustrated in FIG. 4 are provided and a flange 12c including both the connection portions is formed. The inlet pipe connection portion 12a and the outlet pipe connection portion 12b connect the cooling flow channel 19 of the flow channel formation body 12 and the external device. In addition, the housing 10 includes an opening 10a according to the flow channel formation body flange 12c. The flange 12c including the inlet pipe connection portion 12a and the outlet pipe connection portion 12b is exposed to the outside of the housing 10 through the opening 10a formed in the housing 10. The cooling medium enters the flow channel formation body 12 directly from the inlet pipe 13 and is discharged directly from the outlet pipe 14 through the cooling flow channel 19.

Therefore, because the cooling medium does not contact the housing 10, requested specifications for the housing 10 are lowered than those of the housing according to the related art. For example, when the housing is manufactured by aluminum die-casting, in the related art, mechanical processing or impregnation processing is executed on the housing to prevent the leak of the cooling medium. However, in this embodiment, because the mechanical processing or the impregnation processing becomes unnecessary, cost reduction is enabled. In addition, in this embodiment, because an alternate material such as a resin can be selected as a material of the housing 10, weight reduction and cost reduction are enabled.

An internal screw is provided in the flange 12c provided in the flow channel formation body 12 described above. After the sealing member 407 according to the flange shape is installed, the sealing member 407 is fastened to the flange 12c from a vertical direction, using a fastening screw 31, and is fixed to the housing 10. Meanwhile, in FIG. 6(b), at the facing side of the surface to which the inlet and outlet pipes are attached, an internal screw 10c is provided in the housing 10 and the flange 12e of the flow channel formation body 12 is fastened in a vertical direction, using a fastening screw 32.

Because fastening directions of the fastening screw 31 of the side of the flange 12c to which the inlet and outlet pipes are attached and the fastening screw 32 of the facing side are at right angles, if a vibration is applied in the vehicle, stress of a shear direction may be generated in the fastening screw 31 to fracture the fastening screw 31. To prevent the fracture, a support portion 12d is provided in a lower portion of the flange 12c and a support portion 10b is provided in the facing housing 10. As a result, a load of a vertical direction is received by the support portion 12d and the support portion 10 and the stress of the shear direction generated in the fastening screw 31 is suppressed.

FIG. 7 illustrates the flow channel cover 420 to help understanding. FIG. 7(a) is a perspective view of the flow channel cover 420 when viewed from the side contacting the opening surface 400 of the flow channel formation body 12. A convex portion 420a according to the cooling flow channel 19 and the power semiconductor module 300 is formed in the flow channel cover 420 and clearance with a heat dissipation portion provided in the power semiconductor module 300 can be made to be regular and appropriate. Therefore, cooling efficiency is improved.

FIG. 7(b) is a perspective view of the flow channel cover 420 when viewed from the top surface of the flow channel formation body 12. The flow channel cover 420 has a dent shape 420b according to the convex portion 420a and an alternating-current bus bar holding member attachment boss 420c is provided in a dent portion. Because the attachment boss 420c is provided in the dent portion, the height of the boss can be suppressed and the height reduction is enabled.

As illustrated in FIG. 7(b), on a surface of the flow channel cover 420 when viewed from the top surface of the flow channel formation body 12, a circuit board attachment boss 420d is provided. Because the attachment boss 420d can be arranged at any position, a distance between support points when a mechanical vibration is generated can be decreased and a resonant frequency can be increased. Therefore, reliability is improved. In addition, because the flow channel cover 420 is positioned between the power semiconductor module 300 and the circuit board 20, an effect of the electromagnetic shield can be obtained. In the configuration according to the related art, the dedicated metal plate is used. However, in this embodiment, because the metal plate can be integrated with the flow channel cover 420, an effect of cost reduction is obtained. When the effect of the electromagnetic shield/substrate cooling is low, if a conductive thin metal plate is arranged between the bus bar assembly 800 and the circuit board 20, the electromagnetic shield/substrate cooling is enabled. Therefore, even though the metal plate is added, an effect of cost reduction can be obtained.

The detailed configurations of the power semiconductor modules 300a to 300c used in the inverter circuit 140 will be described using FIGS. 8 to 12. Because all of the power semiconductor modules 300a to 300c have the same structure, a structure of the power semiconductor module 300a will be described as a representative example. In FIGS. 7 to 11, a signal terminal 325U corresponds to the gate electrode 154 and the emitter electrode 155 for the signal illustrated in FIG. 2 and a signal terminal 325L corresponds to the gate electrode 164 and the emitter electrode 165 illustrated in FIG. 2. In addition, a direct-current positive electrode terminal 315B is the same as the positive electrode terminal 157 illustrated in FIG. 2 and a direct-current negative electrode terminal 319B is the same as the negative electrode terminal 158 illustrated in FIG. 2. In addition, an alternating-current terminal 321 is the same as the alternating-current terminal 159 illustrated in FIG. 2.

FIG. 8(a) is a perspective view of the case in which a terminal shape of the power semiconductor module 300a according to this embodiment is changed to be easy to explain it. FIG. 8(b) is a cross-sectional view of the power semiconductor module 300a according to this embodiment.

Figure 9:
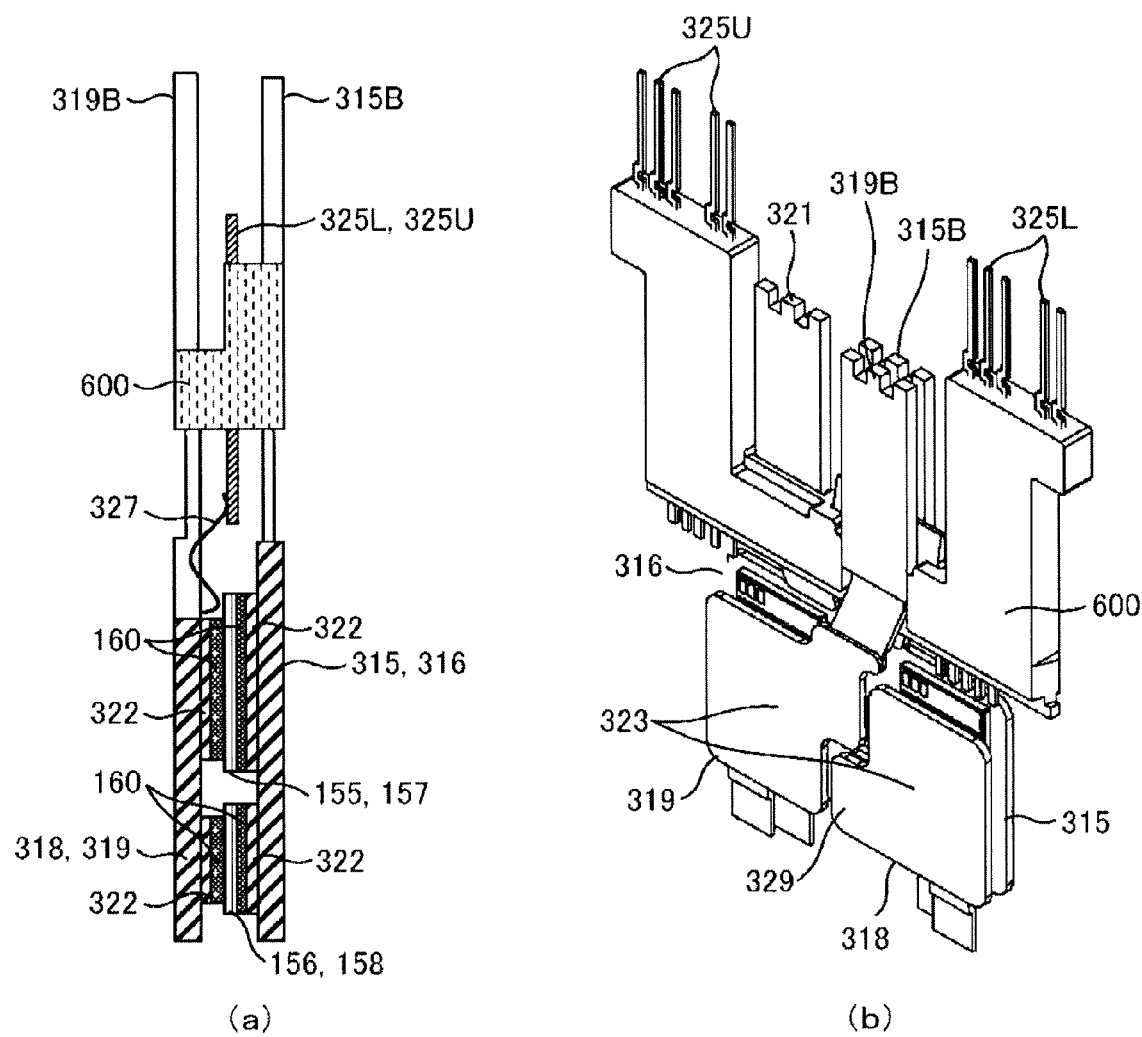
[FIG.9]
Figure 10:
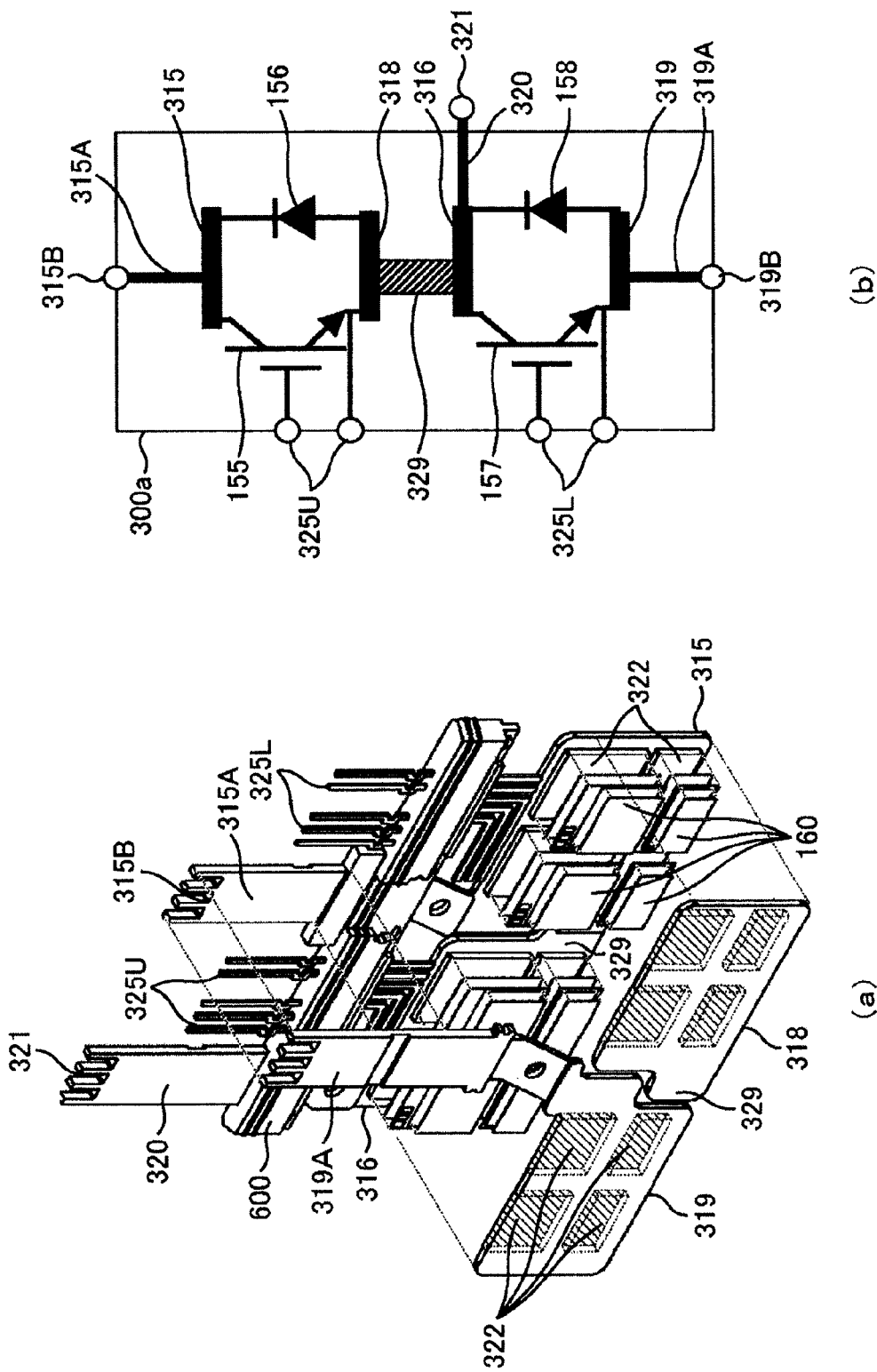
[FIG.10]
Figure 11:
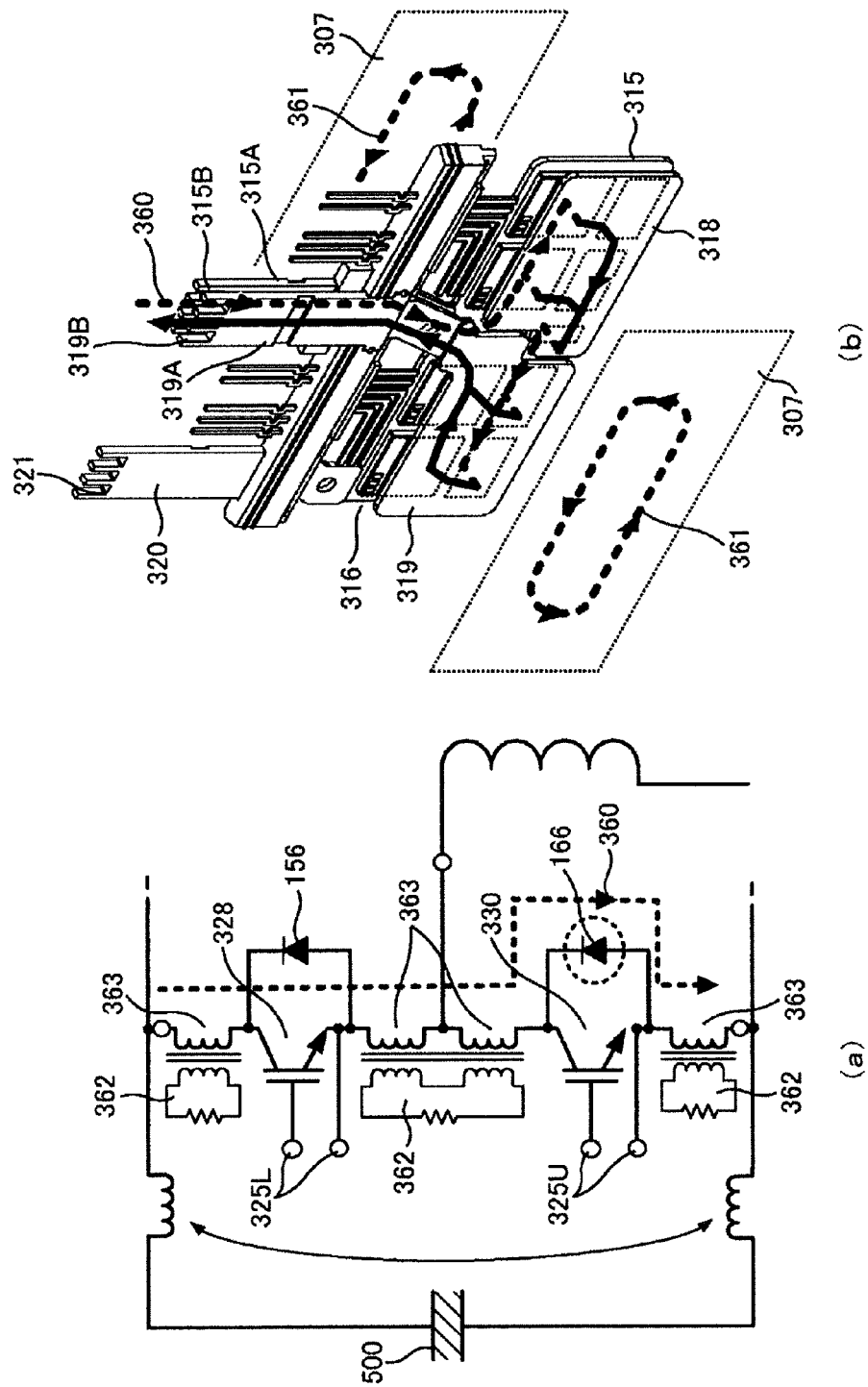
[FIG.11]

The power semiconductor elements (the IGBT 328, the IGBT 330, the diode 156, and the diode 166) forming the series circuit 150 of the upper and lower arms are interposed by a conductor plate 315 and a conductor plate 318 or a conductor plate 316 and a conductor plate 319 from both surfaces and are fixed thereto, as illustrated in FIGS. 9 to 11. In these conductor plates, an auxiliary mold object 600 obtained by integrally forming signal wiring lines to be the signal terminal 325U and the signal terminal 325L is installed. The conductor plate 315 is sealed by a first sealing resin 348 in a state in which a heat dissipation surface thereof is exposed and an insulating sheet 333 are thermally pressed to the heat dissipation surface. A module primary sealing object 302 sealed by the first sealing resin 348 is inserted into a module case 304 and is thermally pressed to an inner surface of the module case 304 to be a CAN-type cooler with the insulating sheet 333 therebetween. Here, the CAN-type cooler is a cooler of a cylindrical shape having an insertion opening 306 provided on one surface and a bottom provided on the other surface.

The module case 304 is made of an aluminum alloy material, for example, Al, AlSi, AlSiC, and Al—C and is formed by integrating or joining a plurality of parts. The module case 304 has a structure in which openings are not provided in portions other than the insertion opening 306 and outer circumference of the insertion opening 306 is surrounded by the flange 304B.

In addition, as illustrated in FIG. 8(a), the first heat dissipation surface 307A and the second heat dissipation surface 307B having surfaces wider than the other surfaces are arranged in a state in which the first and second heat dissipation surfaces face each other. Three surfaces connected to the first heat dissipation surface 307A and the second heat dissipation surface 307B facing each other form surfaces closed with widths narrower than the first heat dissipation surface 307A and the second heat dissipation surface 307B and the insertion opening 306 is formed in the remaining surface of one side. A shape of the module case 304 does not need to be an accurate rectangular parallelepiped and a corner may from a curve surface as illustrated in FIG. 8(a).

By using a metallic case having the above shape, sealing for the cooling medium can be secured in the flange 304B, even though the module case 304 is inserted into the cooling flow channel 19 through which a cooling medium such as water or oil flows. Therefore, with a simple configuration, the cooling medium can be prevented from permeating into the module case 304. In addition, fins 305 are formed regularly in the first heat dissipation surface 307A and the second heat dissipation surface 307B facing each other.

Furthermore, on outer circumferences of the first heat dissipation surface 307A and the second heat dissipation surface 307B, curved portions 304A of which thickness becomes extremely small are formed. Because the thickness of the curved portion 304A becomes extremely small to the extent to which the curved portion is simply deformed by pressurizing the fin 305, productivity after the module primary sealing object 302 is inserted is improved.

The second sealing resin 351 is filled into a void remaining in the module case 304. In addition, as illustrated in FIGS. 9 and 10, a direct-current positive electrode wiring line 315A and a direct-current negative electrode wiring line 319A for electrical connection with the smoothing capacitor module 500 are provided and a direct-current positive electrode terminal 315B (157) and a direct-current negative electrode terminal 319B (158) are formed in front ends thereof. An alternating-current wiring line 320 to supply alternating-current power to a motor generator 194 is provided and an alternating-current terminal 321 (159) is formed in a front end thereof. In this embodiment, the direct-current positive electrode wiring line 315A is formed integrally with the conductor plate 315, the direct-current negative electrode wiring line 319A is formed integrally with the conductor plate 319, and the alternating-current wiring line 320 is formed integrally with the conductor plate 316.

As described above, the conductor plate 315 is thermally pressed to an inner wall of the module case 304 with the insulating sheet 333 therebetween, so that a void between the conductor plate and the inner wall of the module case 304 can be decreased and heat generated in the power semiconductor element can be efficiently transmitted to the fin 305. Furthermore, some thickness and flexibility are maintained in the insulating sheet 333, so that generation of thermal stress can be absorbed by the insulating sheet 333 and this is used suitably for the power conversion apparatus for the vehicle with the rapid temperature change.

FIG. 9 (a) is an internal cross-sectional view of the case in which the module case 304, the insulating sheet 333, the first sealing resin 348, and the second sealing resin 351 are removed, to help understanding. FIG. 9(b) is an internal perspective view.

FIG. 10 (a) is an exploded view to help understanding of a structure of FIG. 9(b). FIG. 10 (b) is a circuit diagram of the power semiconductor module 300. In addition, FIG. 11(a) is a circuit diagram illustrating a reduction effect of inductance and FIG. 11(b) is a perspective view illustrating a flow of a current to describe a reduction action of the inductance.

First, the arrangement of the power semiconductor elements (the IGBT 328, the IGBT 330, the diode 156, and the diode 166) and the conductor plates will be described in association with an electric circuit illustrated in FIG. 10 (b). As illustrated in FIG. 9(b), the conductor plate 315 of the direct-current positive electrode side and the conductor plate 316 of the alternating-current output side are arranged in almost the same planar shape. The collector electrode of the IGBT 328 of the upper arm side and the cathode electrode of the diode 156 of the upper arm side are fixed to the conductor plate 315. The collector electrode of the IGBT 330 of the lower arm side and the cathode electrode of the diode 166 of the lower arm side are fixed to the conductor plate 316.

Likewise, the alternating-current conductor plate 318 and the conductor plate 319 are arranged in almost the same planar shape. The emitter electrode of the IGBT 328 of the upper arm side and the anode electrode of the diode 156 of the upper arm side are fixed to the alternating-current conductor plate 318. The emitter electrode of the IGBT 330 of the lower arm side and the anode electrode of the diode 166 of the lower arm side are fixed to the conductor plate 319. Each power semiconductor element is fixed to an element fixing portion 322 provided in each conductor plate through a metal binding material 160. The metal binding material 160 is, for example, a solder material or a low-temperature sintering binding material including a silver sheet and a minute metal particle.

Each power semiconductor element has a flat structure of a plate shape and each electrode of the power semiconductor element is formed on a surface and a back surface. As illustrated in FIG. 9(a), each electrode of the power semiconductor element is interposed by the conductor plate 315 and the conductor plate 318 or the conductor plate 316 and the conductor plate 319. That is, the conductor plate 315 and the conductor plate 318 have a stacked arrangement structure in which the conductor plates face each other substantially in parallel to each other with the IGBT 328 and the diode 156 therebetween. Likewise, the conductor plate 316 and the conductor plate 319 have a stacked arrangement structure in which the conductor plates face each other substantially in parallel to each other with the IGBT 330 and the diode 166 therebetween. In addition, the conductor plate 316 and the conductor plate 318 are connected through the intermediate electrode 329. By this connection, an upper arm circuit and a lower arm circuit are electrically connected and an upper and lower arm series circuit is formed.

The direct-current positive electrode wiring line 315A and the direct-current negative electrode wiring line 319A form shapes extending substantially in parallel to each other, in a state in which the direct-current positive electrode wiring line and the direct-current negative electrode wiring line face each other with the auxiliary mold object 600 formed of a resin material therebetween. The signal terminal 325U or the signal terminal 325L is formed integrally with the auxiliary mold object 600 and extend in the same direction as the direct-current positive electrode wiring line 315A and the direct-current negative electrode wiring line 319A. As the resin material used in the auxiliary mold object 600, a thermosetting resin or a thermoplastic resin having an insulating property is preferable.

Thereby, the insulating property between the direct-current positive electrode wiring line 315A and the direct-current negative electrode wiring line 319A and the signal terminal 325U and the signal terminal 325L can be secured and high-density wiring is enabled. Furthermore, the direct-current positive electrode wiring line 315A and the direct-current negative electrode wiring line 319A are arranged to face each other in substantially parallel to each other, so that currents flowing instantaneously at the time of a switching operation of the power semiconductor element flow in a reverse direction in a facing state. Thereby, an action of magnetic fields generated by the current being offset is executed and low inductance is enabled by this action.

The action causing the low inductance will be described using FIG. 11(a). In FIG. 11(a), the diode 166 of the lower arm side is conductive in a forward bias state. In this state, if the IGBT 328 of the upper arm side enters an ON state, the diode 166 of the lower arm side enters a reverse bias state and a recovery current due to a carrier movement passes through the upper and lower arms.

At this time, a recovery current 360 illustrated in FIG. 11(b) flows to each of the conductor plates 315, 316, 318, and 319. The recovery current 360 passes through the direct-current positive electrode terminal 315B (157) arranged to face the direct-current negative electrode terminal 319B (158) as illustrated by a dotted line, flows to a path of a loop shape formed by the individual conductor plates 315, 316, 318, and 319, and flows through the direct-current negative electrode terminal 319B (158) arranged to face the direct-current positive electrode terminal 315B (157), as illustrated by a solid line.

A current flows to the path of the loop shape, so that an overcurrent 361 flows to the first heat dissipation surface 307A and the second heat dissipation surface 307B of the module case 304. By a magnetic field offset effect generated by an equivalent circuit 362 in a current path of the overcurrent 361, wiring inductance 363 in the path of the loop shape is decreased.

If a shape of the current path of the recovery current 360 becomes similar to the loop shape, an inductance reduction action increases. In this embodiment, the current path of the loop shape passes through a path close to the side of the direct-current positive electrode terminal 315B (157) of the conductor plate 315 as illustrated by a dotted line and passes through the IGBT 328 and the diode 156. In addition, the current path of the loop shape passes through a path distant from the side of the direct-current positive electrode terminal 315B (157) of the conductor plate 318 as illustrated by a solid line, passes through a path distant from the side of the direct-current positive electrode terminal 315B (157) of the conductor plate 316 as illustrated by a dotted line, and passes through the IGBT 330 and the diode 166. Furthermore, the current path of the loop shape passes through a path close to the side of the direct-current negative electrode wiring line 319A of the conductor plate 319, as illustrated by a solid line. As such, the current path of the loop shape passes through the path of the close side or the distant side with respect to the direct-current positive electrode terminal 315B (157) or the direct-current negative electrode terminal 319B (158), so that a current path of which a shape is similar to the loop shape is formed.

FIG. 12(a) is a perspective view of the auxiliary mold object 600 and FIG. 12(B) is a transmission view of the auxiliary mold object 600.

The auxiliary mold object 600 is integrated with a signal conductor 324 by insertion molding. Here, the signal conductor 324 includes the gate electrode terminal 154 and the emitter electrode terminal 155 of the upper arm side, the gate electrode terminal 164 and the emitter electrode terminal 165 (refer to FIG. 2) of the upper arm side, and a terminal to transmit temperature information of the power semiconductor element. In the description of this embodiment, these terminals are collectively referred to as the signal terminals 325U and 325L.

In the signal conductor 324, the signal terminals 325U and 325L are formed in one end and element side signal terminals 326U and 326L are formed in the other end. The element side signal terminals 326U and 326L are connected to a signal pad provided in a surface electrode of the power semiconductor element by the wire. A first sealing portion 601A forms a shape that extends in a direction crossing a long axis of a shape of the direct-current positive electrode wiring line 315A and the direct-current negative electrode wiring line 319A illustrated in FIG. 10(a) or the alternating-current wiring line 320.

Meanwhile, a second sealing portion 601B forms a shape that extends in a direction substantially parallel to the long axis of a shape of the direct-current positive electrode wiring line 315A and the direct-current negative electrode wiring line 319A or the alternating-current wiring line 320. In addition, the second sealing portion 601B includes a sealing portion to seal the signal terminal 325U of the upper arm side and a sealing portion to seal the signal terminal 325L of the lower arm side.

The auxiliary mold object 600 is formed such that the length thereof is longer than the entire length of the conductor plates 315 and 316 arranged horizontally or the entire length of the conductor plates 319 and 320 arranged horizontally. That is, the length of the conductor plates 315 and 316 arranged horizontally or the length of the conductor plates 319 and 320 arranged horizontally is within a range of the length of a horizontal direction of the auxiliary mold object 600.

The first sealing portion 601A forms a wiring line fitting portion 602B that forms a dent shape and fits the direct-current negative electrode wiring line 319A into a corresponding dent. In addition, the first sealing portion 601A forms a wiring line fitting portion 602A that forms a dent shape and fits the direct-current positive electrode wiring line 315A into a corresponding dent. Furthermore, the first sealing portion 601A forms a wiring line fitting portion 602C that is arranged on the side of the wiring line fitting portion 602A, forms a dent shape, and fits the alternating-current wiring line 320 in a corresponding dent. The individual wiring lines are fitted into the wiring line fitting portions 602A to 602C, so that positioning of the individual wiring lines is performed.

Thereby, filling work of a resin sealing material can be performed after the individual wiring lines are tightly fixed and productivity is improved.

In addition, a wiring line insulting portion 608 protrudes in a direction distant from the first sealing portion 601A, from a portion between the wiring line fitting portion 602A and the wiring line fitting portion 602B. The wiring line insulating portion 608 forming a plate shape is interposed between the direct-current positive electrode wiring line 315A and the direct-current negative electrode wiring line 319A, so that a facing arrangement to realize reduction of inductance and securing of an insulating property at the same time is enabled.

In addition, a mold pressing surface 604 contacting a mold used when a resin is sealed is formed in the first sealing portion 601A. In the mold pressing surface 604, protrusion portions 605 to prevent resin leak when the resin is sealed are formed around outer circumference of a longitudinal direction of the first sealing portion 601. The plurality of protrusion portions 605 are provided to enhance a resin leak prevention effect. Furthermore, because the protrusion portions 605 are provided in the wiring line fitting portions 602A and 602B, the resin sealing material can be prevented from leaking from surrounding portions of the direct-current positive electrode wiring line 315A and the direct-current negative electrode wiring line 319A. Here, as materials of the first sealing portion 601A, the second sealing portion 601B, and the protrusion portion 605, a liquid crystal polymer of a thermoplastic resin, polybutylene terephthalate (PBT), and a polyphenylene sulfide resin (PPS) in which high heat resistance can be expected are desirable when the materials are arranged in a mold of about 150 to 180° C.

Figure 12:
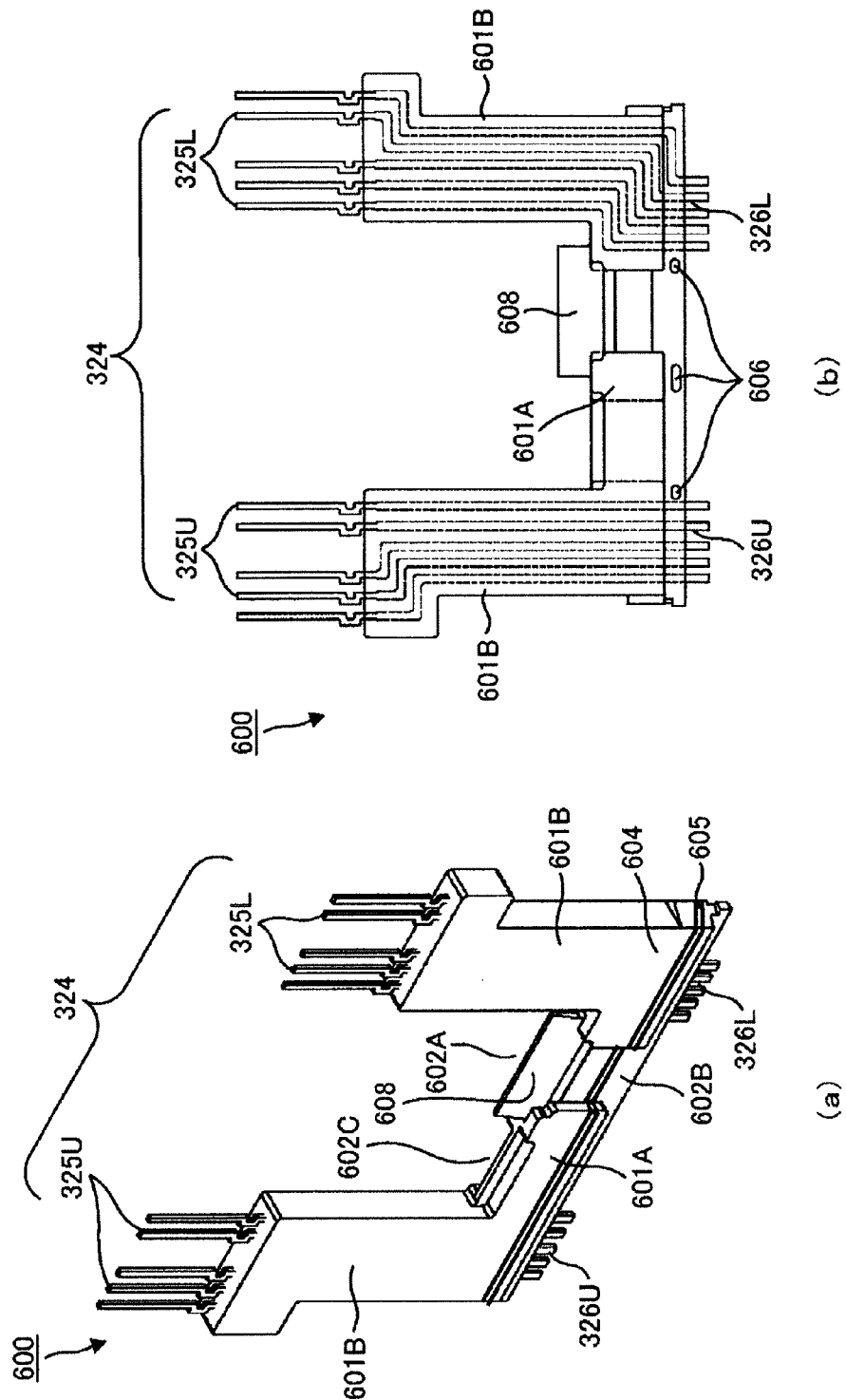
[FIG.12]

In addition, at the side of the power semiconductor element of a short direction of the first sealing portion 601A, a plurality of through-holes 606 illustrated in FIG. 12 (b) are provided in a longitudinal direction. Thereby, the first sealing resin 348 flows into the through-holes 606 and are cured, so that an anchor effect develops, the auxiliary mold object 600 is firmly held in the first sealing resin 348, and the auxiliary mold object 600 and the first sealing resin 348 are not separated from each other, even if stress is applied due to a temperature change or a mechanical vibration. Even though the through-holes are not provided and uneven shapes are configured, the separation of the auxiliary mold object and the first sealing resin from each other becomes difficult. In addition, some effect is obtained by applying a polyimide-based coating material to the first sealing portion 601A or roughening a surface.

In a sealing process of the first sealing resin 348 in the module primary sealing object 302, first, the auxiliary mold object 600 supporting each wiring line is inserted into a mold heated residually at about 150 to 180° C. In this embodiment, because the auxiliary mold object 600, the direct-current positive electrode wiring line 315A, the direct-current negative electrode wiring line 319A, the alternating-current wiring line 320, the conductor plate 315, the conductor plate 316, the conductor plate 318, and the conductor plate 319 are firmly connected, the auxiliary mold object 600 is arranged at the predetermined position, so that a main circuit and the power semiconductor element are arranged at the predetermined positions. Therefore, productivity is improved and reliability is improved.

In addition, the second sealing portion 601B is formed to extend from a surrounding portion of the module case 304 to a surrounding portion of a driver circuit board. Thereby, when heavy current wiring lines are passed and wiring with the driver circuit board is performed, a switching control signal can be normally transmitted even though a wiring line is exposed to a high voltage. In addition, even though the direct-current positive electrode wiring line 315A, the direct-current negative electrode wiring line 319A, the alternating-current wiring line 320, the signal terminal 325U, and the signal terminal 325L protrude in the same direction from the module case 304, electric insulation can be secured and reliability can be secured.

Figure 13:
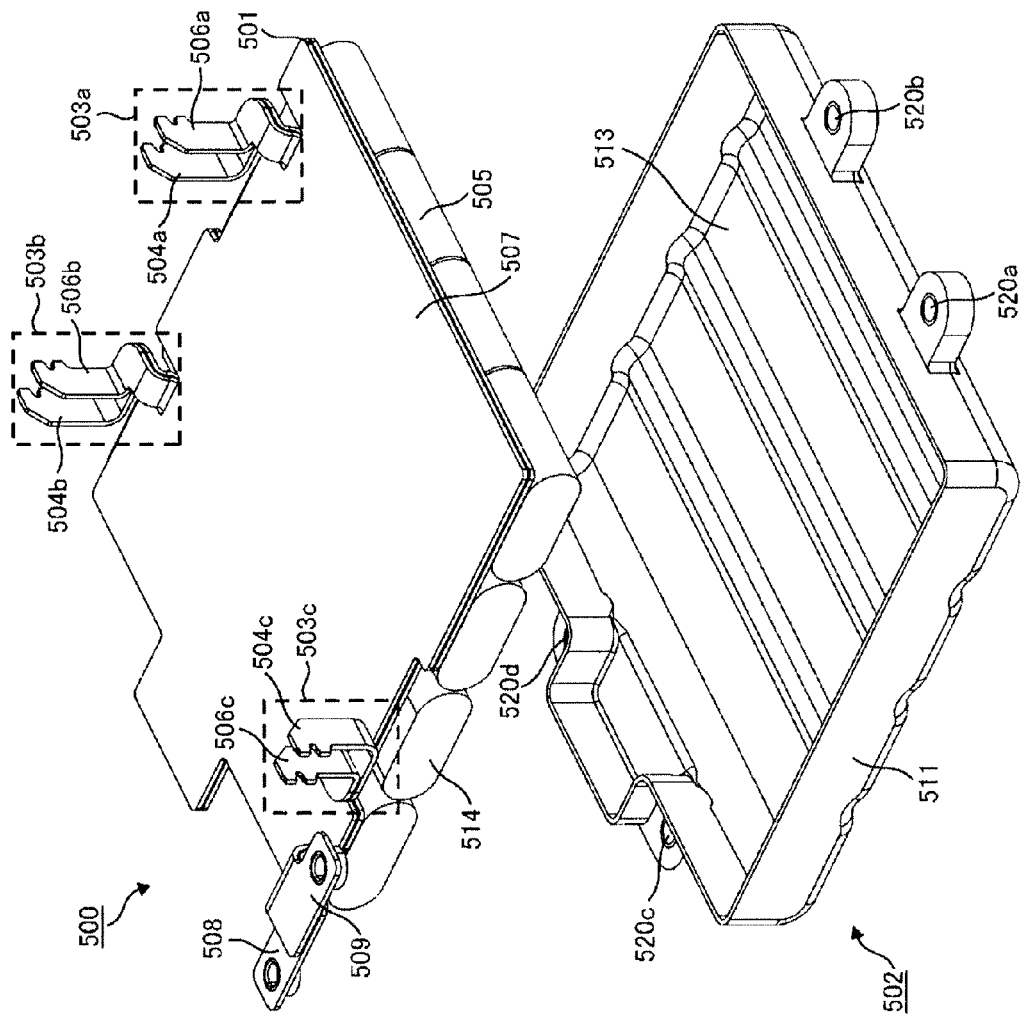
[FIG.13]

FIG. 13 is an exploded perspective view illustrating an internal structure of the smoothing capacitor module 500. A stacked conductor plate 501 includes a negative electrode conductor plate 505 and a positive electrode conductor plate 507 each of which is formed of a wide conductor of a plate shape and an insulating sheet (not illustrated in the drawings) interposed by the negative electrode conductor plate 505 and the positive electrode conductor plate 507. Because the stacked conductor plate 501 makes magnetic fluxes offset with respect to a current flowing through the series circuit 150 of the upper and lower arms of each phase as described below, low impedance is realized for the current flowing through the series circuit 150 of the upper and lower arms. The stacked conductor plate 501 forms an approximately rectangular shape. A power supply terminal 508 of a negative electrode side and a power supply terminal 509 of a positive electrode side are formed in a state in which the power supply terminals are raised from one side of the stacked conductor plate 501 and are connected to the positive electrode conductor plate 507 and the negative electrode conductor plate 505, respectively. Direct-current power is supplied to the power supply terminal 509 of the positive electrode side and the power supply terminal 508 of the negative electrode side through the direct-current connector portion 138, as described in FIG. 2.

Similar to the power supply terminal 508 of the negative electrode side and the power supply terminal 509 of the positive electrode side, a capacitor terminal 503c is raised from one side and capacitor terminals 503a and 503b are formed to correspond to the positive electrode terminal 157 (315B) and the negative electrode terminal 158 (319B) of each power semiconductor module 300, in a state in which the capacitor terminals are raised from an opposite side with the capacitor terminal 503c. The capacitor terminals 503a to 503c are connected to the power semiconductor modules 300a to 300c, respectively. A part of the insulating sheet (not illustrated in the drawings) is provided between a negative electrode side capacitor terminal 504a and a positive electrode side capacitor terminal 506a forming the capacitor terminal 503a and insulating is secured. This is applicable to the other capacitor terminals 503b and 503c. In this embodiment, the negative electrode conductor plate 505, the positive electrode conductor plate 507, the power supply terminal 508 of the negative electrode side, the power supply terminal 509 of the positive electrode side, and the capacitor terminals 503a to 503f are configured by an integrally formed metal plate and have an effect of inductance reduction for the current flowing through the series circuit 150 of the upper and lower arms.

A plurality of capacitor cells 514 are provided on an inner side of the smoothing capacitor module 500 to be a lower side of the stacked conductor plate 501. In this embodiment, four capacitor cells 514 are arranged in a row along one side of the stacked conductor plate 501, the other 12 capacitor cells 514 are arranged in four rows along the other side of the stacked conductor plate 501, and a total of 16 capacitor cells are provided. In this embodiment, the cooling flow channel is provided in a state in which the cooling flow channel approaches a top surface of the smoothing capacitor module 500 and cooling efficiency is improved.

The capacitor cell 514 is a unit structure of a capacitor unit of the smoothing capacitor module 500. As the capacitor cell 514, a film capacitor obtained by stacking two films in which a metal such as aluminum is deposited on a single surface, winding the two films, and configuring two metals as a positive electrode and a negative electrode is used. In the electrodes of the capacitor cells 514, wound axial surfaces become the positive electrode and the negative electrode. The electrodes of the capacitor cells are manufactured by spraying a conductor such as tin.

A capacitor case 502 includes a storage portion 511 to store the capacitor cell 514. In the storage portion 511, a top surface and a bottom surface illustrated in the drawings form an approximately rectangular shape. In the capacitor case 502, fixing mechanisms to fix the smoothing capacitor module 500 to the flow channel formation body 12, for example, holes 520a to 520d to make screws penetrate are provided. A bottom surface portion 513 of the storage portion 511 forms a smooth uneven shape or a corrugated shape in accordance with a surface shape of the cylindrical capacitor cell 514. Thereby, a module in which the stacked conductor plate 501 and the capacitor cell 514 are connected can be easily positioned at the capacitor case 502. In addition, after the stacked conductor plate 501 and the capacitor cell 514 are stored in the capacitor case 502, a filling material (not illustrated in the drawings) is filled into the capacitor case 502 to cover the stacked conductor plate 501, except for the capacitor terminals 503a to 503f, the power supply terminal 508 of the negative electrode side, and the power supply terminal 509 of the positive electrode side. The bottom surface portion 513 forms a corrugated shape in accordance with the shape of the capacitor cell 514. As a result, the capacitor cell 514 can be prevented from being shifted from the predetermined position, when the filling material is filled into the capacitor case 502.

In addition, the capacitor cell 514 emits heat by electric resistance of a thin metal film deposited on an internal film and an internal conductor, due to a ripple current at the time of switching. Therefore, the capacitor cell 514 is molded with the filling material, such that the heat from the capacitor cell 514 is easily released through the capacitor case 502. By using the filling material made of the resin, moisture resistance of the capacitor cell 514 can be improved.

A front end of the alternating-current terminal 321 (159) of the power semiconductor module 300 is connected to front ends of the alternating-current bus bars 801a to 801c by welding.

The bus bar assembly 800 includes the alternating-current bus bars 801a to 801c, a heat transfer member 803, and a bus bar holding member 802. The alternating-current bus bars 801a to 801c and the heat transfer member 803 are fixed to a flow channel cover 420 by the bus bar holding member 802. Because heat generated by supplying electricity to the alternating-current bus bars 801a to 801c is transmitted to the flow channel formation body 12 through the heat transfer member 803, a cooling effect of the alternating-current bus bars 801a to 801c is obtained.

Figure 14:
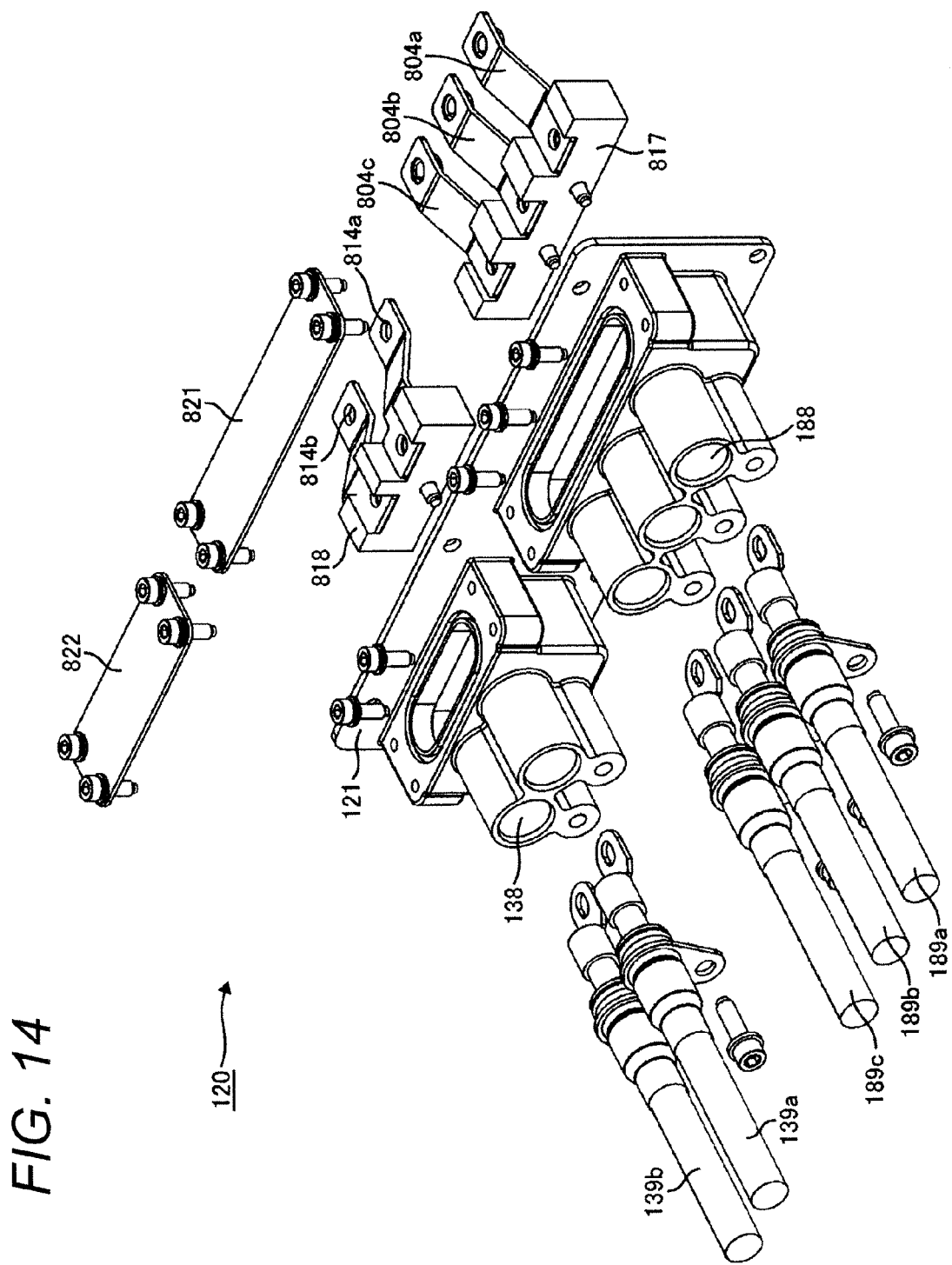
[FIG.14]

FIG. 14 is a perspective view exploded into components to describe an entire configuration of the connector module 120.

Direct-current bus bars 814a and 814b are held by a direct-current bus bar holding member 818 and are fixed to a connector housing 121. One end of the direct-current bus bars 814a and 814b is connected to the power supply terminal 509 of the positive electrode side and the power supply terminal 508 of the negative electrode side included in the smoothing capacitor module 500, respectively.

Second alternating-current bus bars 804a to 804c are held by an alternating-current bus bar holding member 817 and are fixed to the connector housing 121. One end of the second alternating-current bus bars 804a to 804c is connected to the first alternating-current bus bars 801a to 801c included in the power conversion module 200, respectively.

The other ends of the direct-current bus bars 814a and 814b and the second alternating-current bus bars 804a to 804c are generally connected to a direct-current wiring line 139 and an alternating-current wiring line 189 included at the side of the vehicle. In this embodiment, after the direct-current wiring line 139 is inserted into the direct-current connector portion 138 of the connector housing 121, a direct-current bus bar 814 and a direct-current wiring line 139 are fastened by a fastening screw 36 illustrated in FIG. 15 and are sealed by a direct-current connector cover 822. Likewise, after the alternating-current wiring line 189 is inserted into an alternating-current connector portion 188 of the connector housing 121, a second alternating-current bus bar 804 and an alternating-current wiring line 189 are fastened by a fastening screw 35 illustrated in FIG. 15 and are sealed by an alternating-current connector cover 821. In this embodiment, in the connector module 120, the direct-current connector portion 138 and the alternating-current connector portion 188 are integrated with each other. However, the direct-current connector portion and the alternating-current connector portion may be separately manufactured and may be fixed to the housing 10. In addition, in this embodiment, the direct-current wiring line 139 and the alternating-current wiring line 189 may be fastened by a screw. However, even though a method of securing an electric contact using slipping force of a metal is used, the same effect as the above-described effect can be obtained.

Figure 15:
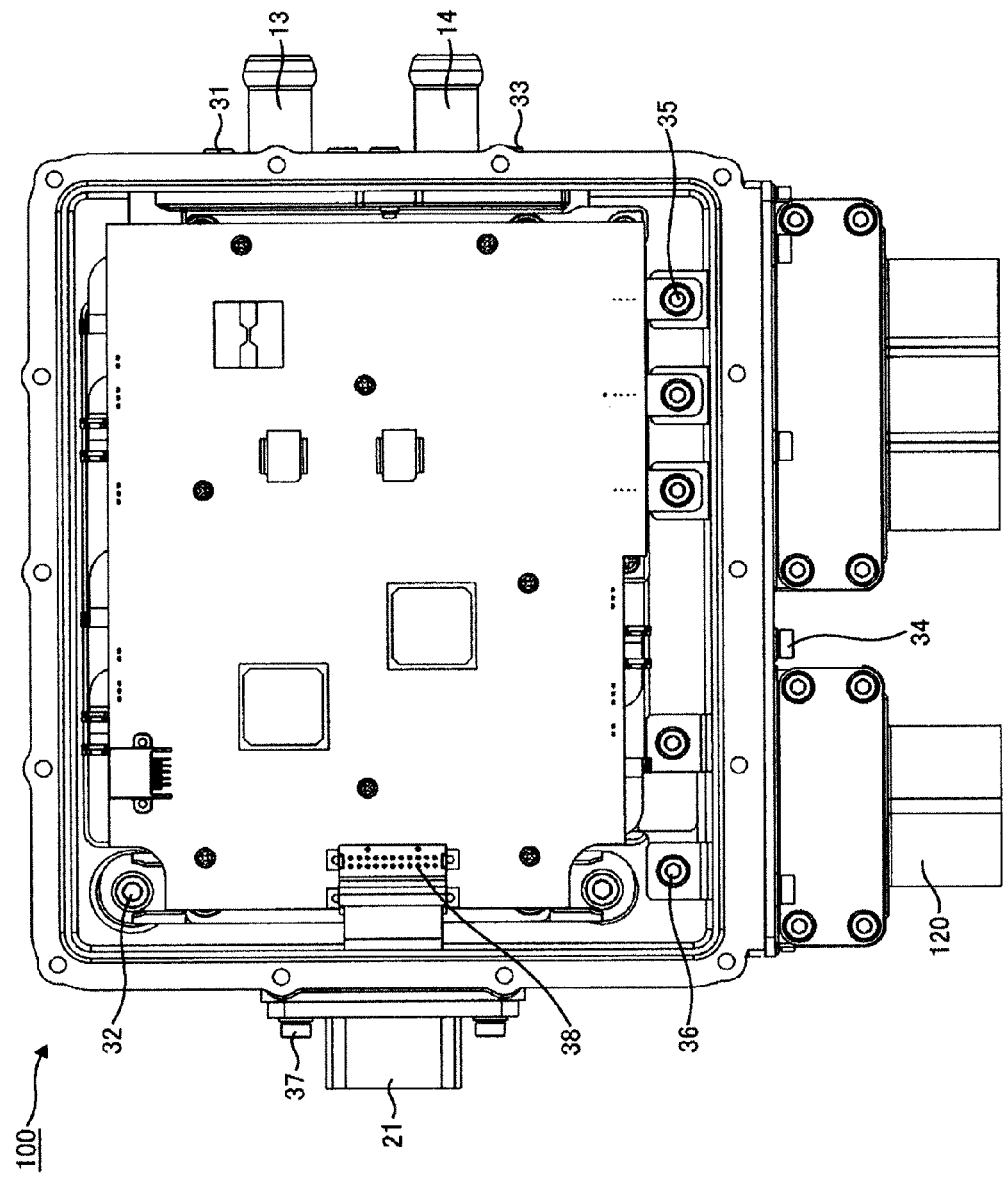
[FIG.15]

FIG. 15 is a top view of a state in which the cover 8 is removed from the power conversion apparatus 100. In addition, FIG. 16 is a perspective view illustrating parts attached to a side of the power conversion apparatus 100 illustrated in FIG. 15 in a manner easy-to-see. The components of the power conversion module 200 are assembled in a module state and the power conversion module is fixed to the housing 10 by fastening screws 31 and 32. The fastening screw 32 performs fastening work from an opening of the housing 10 and the fastening screw 31 performs fastening work from the external side. According to this embodiment, the fixation position of the housing 10 with respect to the vehicle can be freely set by changing only the housing 10 without changing the power conversion module 200. Therefore, effects such as standardization of parts, expense reduction of the mold when the housing 10 is manufactured, standardization of productive facilities, and reduction of design man-hours can be obtained.

Further, the inlet pipe 13, the outlet pipe 14, the connector module 120, and the signal connector 21 are fastened by the fastening screws 33, 34, and 37, the direct-current bus bar 814 and the power supply terminals 508 and 509 are connected by the fastening screw 36 and the first alternating-current bus bar 801 and the second alternating-current bus bar 804 are connected by the fastening screw 35. Furthermore, a substrate connector 38 of the signal connector 21 is inserted into the circuit board 20, so that connection of the individual portions is completed. According to this embodiment, because large width correspondence can be realized by changing only the connection pipes 13 and 14 of the cooling medium to be an interface with an external device, the signal connector 21, the direct-current connector portion 138, and the alternating-current connector portion 188, effects such as standardization of parts, expense reduction of the mold of components, standardization of productive facilities, and reduction of design man-hours can be obtained, in addition to the above-described effects.

FIG. 17 is a cross-sectional view of the flow channel formation body and a cooling medium passage of the power semiconductor module 300. FIG. 17(a) is a cross-sectional view of a configuration according to the related art and FIG.

17(*b*) is a cross-sectional view of this embodiment. In the flow channel formation body, die-cast aluminum is generally used in consideration of strength, a heat dissipation property, a sealing property of a cooling medium, and a cost. The die-casting is a method of emitting melt aluminum to a metal mold at high pressure and extracting a product from the mold after cooling. Therefore, a surface parallel to a mold extraction direction is tapered such that the mold and the product are easily separated from each other, when the product is extracted.

In the configuration according to the related art illustrated in FIG. 17(*a*), the power semiconductor module 300 is inserted from a top surface of a flow channel formation body 901 and a bottom surface of the flow channel formation body 901 is sealed by a lower cover 902. In this configuration, when the flow channel formation body 901 is manufactured by die-casting, the mold is extracted in a die-cast mold extraction direction 912 of an upward direction and a die-cast mold extraction direction 913 of a downward direction with a mold division surface 911 as a boundary. At this time, the surface parallel to the extraction direction needs to be a tapered surface 914 to facilitate separation with the mold. In this state, if the power semiconductor module 300 is installed in the flow channel formation body 901, clearance 916 between the fin 305 for the heat dissipation provided in the power semiconductor module 300 and the tapered surface 914 is different according to a place and the cooling medium passes through a portion in which the clearance 916 is large. For this reason, cooling performance becomes irregular and performance of the power semiconductor module 300 may be lowered. To prevent the performance from being lowered, mechanical processing is executed on the tapered surface 914 to make the clearance 916 regular. However, because the mechanical processing is necessary, a cost increases.

Meanwhile, in the configuration according to this embodiment illustrated in FIG. 17(*b*), the power semiconductor module 300 is inserted from the side of the flow channel formation body 12 and the top surface of the flow channel formation body 12 is sealed by the flow channel cover 420. In this configuration, when the flow channel formation body 12 is manufactured by die-casting, the mold is extracted in a die-cast mold extraction direction 922 of an upward direction. At this time, a tapered surface 924 to be a surface parallel to the extraction direction approaches a side of the power semiconductor module 300 to be a surface forming a right angle with the fin 305 for the heat dissipation in the power semiconductor module 300. Meanwhile, because the surface approaching the fin 305 for the heat dissipation provided in the power semiconductor module 300 becomes a surface 925 that does not need to be tapered, regular and minimum clearance 926 can be secured. As a result, an effect of improving performance of the power semiconductor module 300 can be obtained and because the mechanical processing is not necessary, an effect of reducing a cost can be obtained.

The power conversion apparatus and the system using the power conversion apparatus described in the embodiment resolve various problems that need to be resolved for commercialization of product. As one of the various problems resolved by the embodiment, there is a problem of productivity improvement. The above problems can be resolved by not only the above configuration but also other configurations.

That is, problem resolving and effect achievement regarding the height reduction and the cost reduction are realized by configurations other than the above-described configuration in regards to the problems and the effects of the height reduction and the cost reduction. Specifically, the problems are resolved at a different point of view and the effects are obtained.

Next, a modification to resolve the problems of the height reduction and the cost reduction is described. This modification has a configuration in which the power semiconductor module is inserted from the side of the cooling medium passage, the smoothing capacitor module is arranged on the bottom surface of the cooling medium passage, and the alternating-current bus bar and the circuit board are arranged on the top surface of the cooling medium passage to form the module, the module is installed in the housing, and the electric wiring line, the cooling medium pipe, and the signal wiring line are installed.

By this configuration, the entire configuration of the power conversion apparatus can be arranged in a more ordered state and miniaturization of the power conversion apparatus is enabled. In addition, an effect of the height reduction that can decrease a size in a horizontal direction crossing the cooling medium flow channel, that is, a size of the power conversion apparatus in a vertical direction can be obtained.

With respect to the effects regarding the height reduction and the cost reduction, large effects are obtained particularly in the case of using the power semiconductor module in which the series circuit of the upper and lower arms of the inverter is embedded. However, the same effects can be achieved even in the case of using the power semiconductor module in which any one of the upper and lower arms is inserted.

However, because the power semiconductor modules for the upper arm and the lower arm of the inverter are separately used in the case of using the power semiconductor module in which one arm is inserted, a bus bar configuration to connect the arms increases.

In this modification, the flow channel formation body to form the cooling medium flow channel is provided along the top surface of the smoothing capacitor module and the smoothing capacitor module is fixed to the flow channel formation body, so that the power semiconductor module and the smoothing capacitor module can be cooled down by the cooling medium flow channel. Furthermore, because the alternating-current bus bar or the circuit board can be arranged to be closer to the side of the cooling medium passage, efficient cooling is enabled.

The various embodiments and the modification have been described. However, the present invention is not limited to the above content. Other aspects that are considered within a range of the technical sprit of the present invention are also included in the range of the present invention.

The disclosure content of the following priority basic application is incorporated herein by reference: Japanese Patent Application No. 2011-161533 (filed on Jul. 25, 2011).

The invention claimed is:

1. A power conversion apparatus, comprising:
   a power semiconductor module that has a power semiconductor element to convert a direct current into an alternating current;
   a smoothing capacitor module that smoothes the direct current;
   an alternating-current bus bar that transmits an alternating-current output of the power semiconductor element;
   a control circuit unit that controls the power semiconductor element; and
   a flow channel formation body that forms a flow channel through which a cooling medium flows,
   wherein the power semiconductor module has a first heat dissipation portion and a second heat dissipation portion facing the first heat dissipation portion with the power semiconductor element therebetween, a flow channel formation body external portion of the flow channel formation body has a first surface wall that faces the first heat dissipation portion of the power semiconductor module with the flow channel therebetween, a second surface wall that faces the second heat dissipation portion of the power semiconductor module with the flow channel therebetween, at the opposite side of the first surface wall with the power semiconductor module therebetween, and a sidewall that connects the first surface wall and the second surface wall, the sidewall has an opening to insert the power semiconductor module into the flow channel, the smoothing capacitor module is arranged at a position facing the second surface wall of the flow channel formation body external portion, the alternating-current bus bar is arranged at a position facing the first surface wall of the flow channel formation body external portion, and the control circuit unit is arranged at a position facing the alternating-current bus bar, at the opposite side of the first surface wall of the flow channel formation body external portion with the alternating-current bus bar therebetween.

2. The power conversion apparatus according to claim 1, wherein the flow channel formation body is formed to be physically separated from a housing and is fixed to the housing by a fixator.

3. The power conversion apparatus according to claim 1, wherein the power semiconductor module, the smoothing capacitor module, the alternating-current bus bar, and the control circuit unit are further installed in a housing in a state in which the power semiconductor module, the smoothing capacitor module, the alternating-current bus bar, and the control circuit unit are installed in the flow channel formation body.

4. The power conversion apparatus according to claim 1, wherein a connection portion of the flow channel of the flow channel formation body and an external device is exposed to the outside of the housing through an opening formed in the housing.

5. The power conversion apparatus according to claim 1, further comprising:

a flange portion that includes a connection portion of the flow channel of the flow channel formation body and an external device, wherein the flange portion includes a sealing member in a portion contacting a case becoming a casing.

6. The power conversion apparatus according to claim 1, wherein the first surface wall of the flow channel formation body has an opening and the flow channel formation body further includes a flow channel cover to close the opening of the first surface wall.

7. The power conversion apparatus according to claim 6, wherein a shape of a surface of the flow channel side of the flow channel cover is a convex shape corresponding to an internal shape of the flow channel formation body and an external shape of the power semiconductor module.

8. The power conversion apparatus according to claim 7, wherein a surface of the side opposite to the flow channel side of the flow channel cover includes a dent portion in accordance with the convex shape and the flow channel cover has a boss to fix the alternating-current bus bar to the dent portion.

9. The power conversion apparatus according to claim 1, wherein the flow channel formation body has a boss to attach a current sensor.

10. The power conversion apparatus according to claim 1, wherein the flow channel formation body has a boss to attach a circuit board.

11. The power conversion apparatus according to claim 1, wherein the control circuit unit is configured by arranging individual parts forming a driver circuit and a control circuit on one substrate.

12. The power conversion apparatus according to claim 1, wherein a minimum distance between the first surface wall and the second surface wall of the flow channel formation body is almost equal to a dimension of a flange included in a case of the power semiconductor module.

13. The power conversion apparatus according to claim 1, wherein the flow channel formation body is manufactured by a manufacturing method to cast a predetermined material in a mold, a surface of the sidewall is a tapered surface having an inclination, and surfaces of the first surface wall and the second surface wall are surfaces that do not need to be tapered.

14. The power conversion apparatus according to claim 1, wherein the power conversion apparatus is connected to a motor, the alternating-current bus bar transmits the alternating-current output to the motor, the flow channel of the flow channel formation body is formed in an U shape by providing partition walls, and the power semiconductor module is inserted into the flow channel through the opening of the sidewall in a direction vertical to a flowing direction of the cooling medium flowing through the flow channel and the first heat dissipation portion and the second heat dissipation portion are parallel to the first surface wall and the second surface wall, respectively.

* * * * *